(12) United States Patent
Voerckel

(10) Patent No.: US 12,087,812 B2
(45) Date of Patent: Sep. 10, 2024

(54) METHOD OF MANUFACTURING A SEMICONDUCTOR DEVICE UTILZING TWO HARD MASKS AND TWO AUXILIARY MASKS TO FORM PN JUNCTIONS STRUCTURE

(71) Applicant: Infineon Technologies AG, Neubiberg (DE)

(72) Inventor: Andreas Voerckel, Finkenstein (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 528 days.

(21) Appl. No.: 17/374,046

(22) Filed: Jul. 13, 2021

(65) Prior Publication Data

US 2022/0020846 A1  Jan. 20, 2022

(30) Foreign Application Priority Data

Jul. 16, 2020  (EP) .................................. 20186280

(51) Int. Cl.
| | |
|---|---|
| *H01L 21/761* | (2006.01) |
| *H01L 21/04* | (2006.01) |
| *H01L 21/76* | (2006.01) |
| *H01L 29/06* | (2006.01) |
| *H01L 29/16* | (2006.01) |

(52) U.S. Cl.
CPC ...... *H01L 29/0634* (2013.01); *H01L 21/0465* (2013.01); *H01L 21/7602* (2013.01); *H01L 21/761* (2013.01); *H01L 29/1608* (2013.01)

(58) Field of Classification Search
CPC ............... H01L 21/0465; H01L 21/761; H01L 29/0634
See application file for complete search history.

(56) References Cited

U.S. PATENT DOCUMENTS

| | | | |
|---|---|---|---|
| 2003/0207536 A1* | 11/2003 | Miyasaka | ........... H01L 29/6609 257/E21.418 |
| 2008/0246085 A1 | 10/2008 | Saito et al. | |
| 2008/0315299 A1 | 12/2008 | Saito et al. | |
| 2011/0068397 A1* | 3/2011 | Disney | ................ H01L 29/0634 257/341 |
| 2013/0075855 A1 | 3/2013 | Guan et al. | |

(Continued)

*Primary Examiner* — Anh D Mai
(74) *Attorney, Agent, or Firm* — Cooper Legal Group LLC

(57) ABSTRACT

In an example, a first hard mask is formed on a first surface of a semiconductor body, wherein first openings in the first hard mask expose first surface sections and second openings in the first hard mask expose second surface sections. First dopants of a first conductivity type are implanted selectively through the first openings into the semiconductor body. Second dopants of a second conductivity type are implanted selectively through the second openings into the semiconductor body. The second conductivity type is complementary to the first conductivity type. A second hard mask is formed that covers the first surface sections and the second surface sections, wherein third openings in the second hard mask expose third surface sections and fourth openings in the second hard mask expose fourth surface sections. Third dopants of the first conductivity type are implanted selectively through the third openings into the semiconductor body. Fourth dopants of the second conductivity type are implanted selectively through the fourth openings into the semiconductor body.

17 Claims, 16 Drawing Sheets

(56) References Cited

U.S. PATENT DOCUMENTS

2013/0093003 A1* 4/2013 Irifune ............... H01L 29/7802
  257/329
2014/0264477 A1   9/2014 Bhalla et al.
2018/0374919 A1* 12/2018 Tilke ................... H01L 29/0634
2023/0006038 A1* 1/2023 Hell .................... H01L 29/7813

* cited by examiner

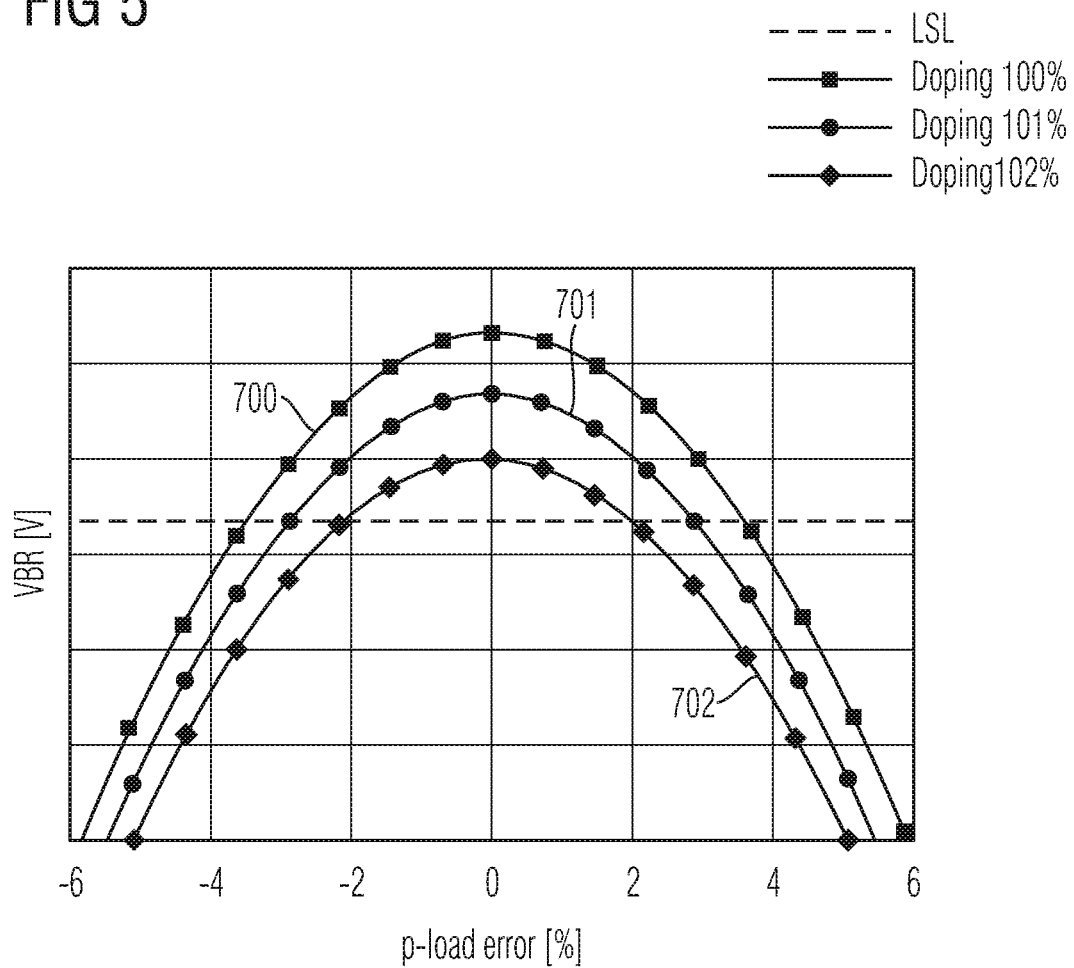

METHOD OF MANUFACTURING A SEMICONDUCTOR DEVICE UTILZING TWO HARD MASKS AND TWO AUXILIARY MASKS TO FORM PN JUNCTIONS STRUCTURE

RELATED APPLICATION

This application claims priority to European Patent Application No. 20186280.2, filed on Jul. 16, 2020, entitled "SEMICONDUCTOR DEVICE WITH COMPLEMENTARILY DOPED REGIONS AND METHOD OF MANUFACTURING", which is incorporated by reference herein in its entirety.

TECHNICAL FIELD

Examples of the present disclosure relate to a method of manufacturing a semiconductor device with complementarily doped stripe-shaped regions, for example to a semiconductor device including a charge compensation structure and provided from a semiconductor material in which dopants have low diffusion coefficients. Other examples concern a semiconductor device with complementarily doped stripe-shaped regions, for example a semiconductor device including a charge compensation structure.

BACKGROUND

Semiconductor devices may include semiconducting structures including a sequence of alternatingly doped regions, wherein the ratio of the quantity of the dopants in doped regions of opposite conductivity type may match predefined boundary conditions. For example, power semiconductor switches such as MOSFETs (metal oxide semiconductor field effect transistors) may include a charge compensation structure that facilitates combining high breakdown voltage capability and low on-state resistance. The charge compensation structure includes a pattern of p-type columns and n-type columns which completely deplete in the blocking state. Vital device parameters and device reliability strongly depend on how precisely the ratio between the amount of dopants in the p-type columns and the amount of dopants in the n-type columns matches a predefined condition. There is a need for improving methods of manufacturing a semiconductor device with alternatingly arranged n-doped and p-doped regions.

SUMMARY

An embodiment of the present disclosure relates to a method of manufacturing a semiconductor device. A first hard mask is formed on a first surface of a semiconductor body, wherein first openings in the first hard mask expose first surface sections (e.g., first sections of the first surface) and second openings in the first hard mask expose second surface sections (e.g., second sections of the first surface). First dopants of a first conductivity type are implanted selectively through the first openings into the semiconductor body. Second dopants of a second conductivity type are implanted selectively through the second openings into the semiconductor body. The second conductivity type is complementary to the first conductivity type. A second hard mask is formed that covers the first surface sections and the second surface sections, wherein third openings in the second hard mask expose third surface sections (e.g., third sections of the first surface) and fourth openings in the second hard mask expose fourth surface sections (e.g., fourth sections of the first surface). Third dopants of the first conductivity type are implanted selectively through the third openings into the semiconductor body. Fourth dopants of the second conductivity type are implanted selectively through the fourth openings into the semiconductor body.

An embodiment of the present disclosure relates to a semiconductor device. The semiconductor device includes stripe-shaped first doped regions of a first conductivity type and stripe-shaped second doped regions of a second conductivity type. The second conductivity type is complementary to the first conductivity type. Longitudinal axes of the first doped regions and the second doped regions run parallel to a horizontal first direction. The first doped regions and the second doped regions alternate along a horizontal second direction orthogonal to the first direction. Doped regions, of the first doped regions and the second doped regions, that are between two outermost doped regions of the first doped regions and the second doped regions, have a first width extension. The two outermost doped regions of the first doped regions and the second doped regions have a second width extension. The second width extension is in a range from 25% to 75% of the first width extension.

An embodiment of the present disclosure relates to a silicon carbide device. The silicon carbide device includes stripe-shaped first doped regions of a first conductivity type and stripe-shaped second doped regions of a second conductivity type. The second conductivity type is complementary to the first conductivity type. The first doped regions and the second doped regions are formed in a silicon carbide body. Horizontal longitudinal axes of the first doped regions and the second doped regions run parallel to a horizontal first direction. The first doped regions and the second doped regions alternate along a horizontal second direction orthogonal to the first direction. The first doped regions and the second doped regions have a first width extension along the second direction. Along a first line, that is parallel to the second direction and is through a first doped region of the first doped regions, the following conditions are met: a first dopant concentration deviates from a first mean dopant concentration along the first line by not more than 15% across at least 75% of the first width extension, a first dopant concentration maximum deviates by not more than 20% from the first mean dopant concentration and a position of the first dopant concentration maximum deviates by not more than 10% of the first width extension from a lateral center of the first doped region. Alternatively and/or additionally, along a second line, that is parallel to the second direction and is through a second doped region of the second doped regions, the following conditions are met: a second dopant concentration deviates from a second mean dopant concentration along the second line by not more than 15% across at least 75% of the first width extension, a second dopant concentration maximum deviates by not more than 20% from the second mean dopant concentration and a position of the second dopant concentration maximum deviates by not more than 10% of the first width extension from a lateral center of the second doped region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a semiconductor device and a method of manufacturing a semiconductor device and together with the description serve to explain principles of the embodiments. Further embodiments are described in the following detailed description and the claims.

FIG. 5 shows a schematic diagram illustrating a process window for a charge compensation structure for discussing effects of the embodiments.

DETAILED DESCRIPTION

Figure 1A:
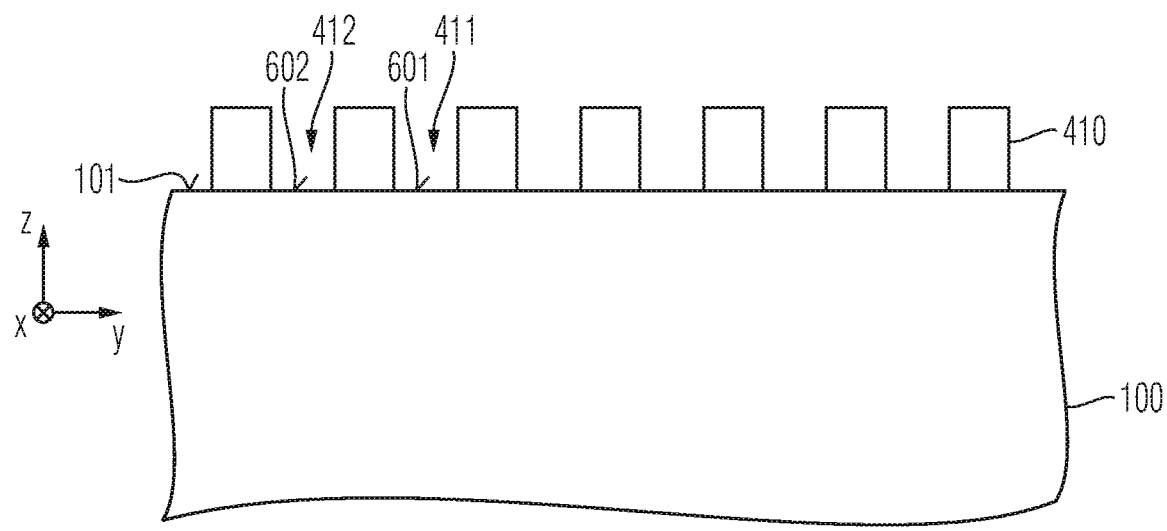
FIGS. 1A-1F show schematic vertical cross-sectional views of a portion of a semiconductor body for illustrating a method of manufacturing a semiconductor device with oppositely doped regions according to an embodiment.

In the following detailed description, reference is made to the accompanying drawings, which form a part hereof and in which are shown by way of illustrations specific embodiments in which a semiconductor device and a method of manufacturing a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening elements adapted for signal and/or power transmission may be connected between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Ranges given for physical dimensions include the boundary values. For example, a range for a parameter y from a to b reads as a≤y≤b. The same holds for ranges with one boundary value like "at most" and "at least".

A conformal layer has a thickness that is substantially the same along an interface to a base on which the conformal layer is formed. A conformal layer may exhibit marginal thickness variations along edges, steps or other elements of the base but is nevertheless considered a conformal layer if the magnitude of the thickness variations is low compared to a mean thickness of the conformal layer. A conformal layer may be formed by thin-film deposition methods such as CVD (chemical vapor deposition), plating, or ALD (atomic layer deposition).

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

As regards structures and doped regions formed in a semiconductor body, a second region is "below" a first region if a minimum distance between the second region and a first surface at the front side of the semiconductor body is greater than a maximum distance between the first region and the first surface. The second region or a junction is "directly below" the first region, where the vertical projections of the first and second regions or the vertical projections of the first region and the junction into the first surface overlap. The vertical projection is a projection orthogonal to the first surface. A "horizontal plane" is a plane parallel to a planar first surface or parallel to coplanar surface sections of the first surface.

According to an embodiment, a method of manufacturing a semiconductor device may include forming a first hard mask on a first surface of a semiconductor body, wherein first openings in the first hard mask expose first surface sections and second openings expose second surface sections.

The semiconductor body may have two essentially parallel main surfaces, which may have approximately the same shape and size. The semiconductor body may be integral portion of a semiconductor substrate, e.g. a semiconductor wafer. The semiconductor substrate may include a plurality of identical or almost identical semiconductor bodies formed side-by-side in lines and rows and separated from each other by straight kerf streets.

The semiconductor body may have a surface extension along two horizontal directions. The horizontal directions are parallel to an x-axis and to a y-axis, wherein x-axis and y-axis are orthogonal to each other. The semiconductor body may have a thickness along a vertical direction perpendicular to the horizontal directions. The vertical direction is parallel to a z-axis, which is orthogonal to the x-axis and to the y-axis. In the following, the horizontal directions are also referred to as lateral directions. The main surface at the front side is referred to as first surface. The main surface on the opposite side of the semiconductor body is referred to as second surface.

The semiconductor body includes a semiconducting portion formed from a single crystalline semiconductor. The semiconductor may be a group IV elemental semiconductor, e.g. silicon (Si) or germanium (Ge), a group IV compound semiconductor, e.g. silicon carbide (SiC) or silicon germanium (Site), or a group III-V semiconductor such as gallium nitride (GaN) or gallium arsenide (GaAs), by way of example. For example, the semiconductor may be SiC with a hexagonal polytype like 2H—SiC, 4H—SiC or 6H—SiC. In addition to the main constituents, e.g. silicon (Si) and carbon (C), the semiconductor may include dopant atoms, for example nitrogen (N), phosphorous (P), beryllium (Be), boron (B), aluminum (Al) and/or gallium (Ga). The semiconductor may also include further impurities such as hydrogen (H), fluorine (F) and/or oxygen (O).

In addition to the semiconducting portion, the semiconductor body may include functional structures from other materials like polycrystalline silicon, dielectrics, elemental metals, metal compounds and/or metal alloys. The functional structures may be formed in trenches extending from the first or second surface into the semiconducting portion or may be formed on the first surface and/or on the second surface.

Dopants of a first conductivity type may be implanted selectively through the first openings into the semiconductor body. Dopants of a second conductivity type may be implanted selectively through the second openings into the semiconductor body. The first and second dopants have complementary conductivity types. For example, p-type dopants may have a conductivity type that is complementary to a conductivity type of n-type dopants (e.g., the first dopants may comprise p-type dopants and the second dopants may comprise n-type dopants, or the first dopants may comprise n-type dopants and the second dopants may comprise p-type dopants). In addition, further dopants may be implanted through both the first and the second openings of the first hard mask.

A second hard mask may be formed. The second hard mask may cover the first and second surface sections. Third openings in the second hard mask may expose third surface sections of the first surface. Fourth openings in the second hard mask may expose fourth surface sections of the first surface.

The second hard mask may cover at least 90% of a total surface area of the first and second surface sections. For example, the second hard mask may cover the first and second surface sections completely. The second hard mask may exclusively cover the first and second surface sections. Alternatively sections of the second hard mask on the first and second surface sections may laterally extend across sections of the first surface that adjoin (e.g., directly adjoin) the first and/or the second surface sections.

Dopants of the first conductivity type may be implanted selectively through the third openings into the semiconductor body. Dopants of the second conductivity type may be implanted selectively through the fourth openings into the semiconductor body. In addition, further dopants may be implanted through both the third and the fourth openings of the second hard mask.

By way of example, the width of the first openings and the width of the second openings may be equal or almost equal, wherein a difference between the widths of the first and second openings is not more than 20% of a sum of the widths of the first and second openings. The widths of the third openings and the fourth openings may be equal or almost equal, wherein a difference between the widths of the third and fourth openings is not more than 20% of a sum of the widths of the third and fourth openings. A mean width of the third and fourth openings may deviate by at most 50% from a mean width of the first and second openings.

The dopants of the first conductivity type implanted through the first openings in the first hard mask and the dopants of the first conductivity type implanted through the third openings in the second hard mask may form a combined first implant zone. Activation of the implanted dopants converts the combined first implant zone into a first doped region. The dopants of the second conductivity type implanted through the second openings in the first hard mask and the dopants of the second conductivity type implanted through the fourth openings in the second hard mask may form a combined second implant zone. Activation of the implanted dopants converts the combined second implant zone into a second doped region.

The sum of the width of the first opening in the first hard mask and the width of the third opening in the third hard mask gives the effective mask width for forming the first doped region.

The width of the third openings is a function of the width of the first openings, wherein the width of the third openings may decrease at the same scale at which the width of the first openings increases and wherein the width of the third openings may increase at the same scale at which the width of the first openings decreases.

The effective mask width for forming the first doped region is to a high degree independent from fluctuations of the width of the first mask opening. Since the amount of dopants implanted through a mask opening depends on the cross-sectional area of the mask opening, and since an inherent modification of the width of the third mask opening compensates fluctuations of the width of the first mask opening, the amount of dopants in the first doped region defined by implants through the first and third openings is largely independent from process fluctuations affecting the width of the first and second mask openings. The same holds for the second doped regions.

According to an embodiment, the semiconductor body may include a silicon carbide layer. For example, the semiconductor body may be a silicon carbide body that may include an intrinsic or lightly doped epitaxial silicon carbide layer. Throughout the present disclosure, a lightly doped layer and/or a lightly doped region may correspond to a doped layer and/or a doped region having a dopant concentration less than a threshold dopant concentration. The first and second dopants may be implanted into the silicon carbide body, e.g. into the intrinsic or lightly doped epitaxial silicon carbide layer. In silicon carbide, the diffusion coefficients for the dopant ions are low (e.g., lower than a threshold). Only little lateral interdiffusion of the implanted dopants occurs (e.g., less than a threshold amount of lateral interdiffusion of the implanted dopants occurs). It is therefore possible to define the lateral extension of the combined implant zones with high precision (e.g., precision higher than a threshold precision).

According to an embodiment, the first openings and/or the second openings may be stripe-shaped with a longitudinal extension along a lateral first direction, which is parallel to the x-axis.

The first hard mask may include mask stripes with a longitudinal extension along the x-axis, wherein each mask stripe may laterally separate a first opening and a second opening. The second hard mask may include mask stripes with a longitudinal extension along the x-axis, wherein each mask stripe may laterally separate a third opening and a fourth opening.

According to an embodiment, the first surface sections and the second surface sections may alternate (e.g., strictly alternate) along a horizontal second direction orthogonal to the first direction. The second direction is parallel to the y-axis. Implanting the first and second dopants results in stripe-shaped n-doped and p-doped doped regions. The stripe-shaped n-doped and p-doped doped regions may be n-doped and p-doped columnar portions of a charge compensation structure, wherein the amount of dopants in the n-doped columnar portions and the amount of dopants in the p-doped columnar portions can be adjusted with high precision (e.g., precision higher than a threshold precision).

According to an embodiment, a conductivity type of dopants implanted through an outermost one of the first, second, third, and fourth openings is complementary to a conductivity type of dopants implanted through a second outermost one of the first, second, third, and fourth openings. A second outermost opening of the first, second, third, and fourth openings may be an opening having a location that is adjacent to and/or closest to a location of an outermost opening of the first, second, third, and fourth openings. For example, among locations of openings (e.g., openings, other than the outermost opening, of the first, second, third, and fourth openings), a location of the second outermost opening is closest to a location of the outermost opening.

For example, with stripe-shaped first, second, third and fourth openings, the width of the outermost stripes may be about half of the width of the other stripes. As a result, in a field with parallel stripe-shaped dopant regions, the outermost dopant regions may be about half as wide as the other stripe-shaped dopant regions. In a charge compensation structure including parallel, stripe-shaped dopant regions, a predefined degree of charge compensation can be achieved even at the edges of the charge compensation structures with high precision (e.g., precision higher than a threshold precision) at low additional effort.

According to an embodiment, the first hard mask may include a central mask section and a peripheral mask section. The central mask section and the peripheral mask section may be formed along the first direction (x-axis). In other words, the peripheral mask section is formed in the horizontal longitudinal projection of the mask openings and the mask stripes of the central mask section. The peripheral mask section may include two sub-portions at opposite sides of the central mask section.

The first and second openings in the peripheral mask section may be laterally shifted with respect to the first and second openings in the central mask section along the second direction.

The first mask openings in the central mask section and the first mask openings in the peripheral mask section may have the same width. The second mask openings in the central mask section and the second mask openings in the peripheral mask section may have the same width.

In addition or alternatively, the first mask openings in the central mask section and the mask stripes in the peripheral mask section may have the same width, and the second mask openings in the central mask section and the mask stripes in the peripheral mask section may have the same width. For example, along the x-axis, the first and second openings in the peripheral mask section may end at the mask stripes of the central mask section. The first and second openings in the central mask section may end at the mask stripes of the peripheral mask section.

The peripheral mask section and the central mask section may be formed side-by-side. For example, the peripheral mask section and the central mask section may be formed in juxtaposition to each other such that the front ends of the mask stripes of the peripheral mask section and the front ends of the mask stripes of the central mask section end in a same vertical plane. According to another example, the peripheral mask section and the central mask section may overlap (e.g., slightly overlap) such that the mask stripes of the peripheral mask section end between the mask stripes of the central mask section. According to a further example, the peripheral mask section and the central mask section may be spaced apart (e.g., slightly spaced apart) from each other such that the mask stripes of the peripheral mask section and the mask stripes of the central mask section are without contact and do not overlap along the x-axis.

According to an embodiment, a first auxiliary mask covering and/or filling the second openings and exposing the first openings in the first hard mask may be formed prior to implanting the dopants of the first conductivity type into the first surface sections. Prior to implanting the dopants of the second conductivity type into the second surface sections, a second auxiliary mask may be formed that covers and/or fills the first openings and exposes the second openings in the first hard mask. The first auxiliary mask may be removed prior to forming the second auxiliary mask. The first and second auxiliary mask may be formed from materials, which may be removed at high selectivity (e.g., selectivity higher than a threshold selectivity) against the first hard mask.

A third auxiliary mask covering and/or filling the fourth openings and exposing the third openings in the second hard mask may be formed prior to implanting the dopants of the first conductivity type into the third surface sections. Prior to implanting the dopants of the second conductivity type into the fourth surface sections, a fourth auxiliary mask may be formed that covers and/or fills the third openings and that exposes the fourth openings in the second hard mask. The third auxiliary mask may be removed prior to forming the fourth auxiliary mask. The third and fourth auxiliary mask may be formed from materials, which may be removed at high selectivity (e.g., selectivity higher than a threshold selectivity) against the second hard mask.

For example, the auxiliary masks may be formed from one or more negative or positive photoresist materials.

According to an embodiment the second hard mask may be formed in the first and second openings of the first hard mask.

The width of the third openings and fourth openings in the second hard mask can be directly tied to the width of the mask stripes of the first hard mask. Fluctuations of the widths of the first and second openings can be compensated (e.g., almost perfectly).

For example, the first hard mask may include and/or consist of a first mask material and the second hard mask may include and/or consist of a second mask material, wherein the first hard mask material and the second hard mask material differ in composition and/or internal configuration such that the first mask material can be removed at high selectivity (e.g., selectivity higher than a threshold selectivity) against the second mask material. The second hard mask may be formed by a Damascene process, wherein removal of the first hard mask does not or only to a highly reproducible degree affect the second hard mask material. Alternatively, the second hard mask may be formed after removal of the first hard mask.

According to an embodiment, a lateral width of the first and second openings in the first hard mask may be decreased prior to implanting the dopants through the first and second openings. Alternatively or in addition, a lateral width of the third and fourth openings in the second hard mask may be decreased prior to implanting the dopants through the third and fourth openings.

For example, sidewall spacers may be formed along vertical sidewalls of the first and second openings. The sidewall spacers may be formed by depositing a conformal layer (e.g., a highly conformal layer) with a thickness less than half of the smaller width of the first and second openings. The sidewall spacers may be removed after implanting dopants through the first and/or second openings in the first hard mask. Alternatively or in addition, sidewall spacers may be formed along vertical sidewalls of the third and fourth openings in the second hard mask.

The sidewall spacers may facilitate compensating a lateral recess of the mask stripes of the second hard mask and/or may be used to increase a lateral distance of the implants and to reduce inter diffusion between oppositely doped regions.

According to an embodiment, the implanted dopants may be activated. By activation, the implanted dopants of the first conductivity type may form first doped regions in the semiconductor body below the first and third surface sections and the implanted dopants of the second conductivity type may form second doped regions in the semiconductor body below the second and fourth surface sections.

The stripe-shaped n-doped and p-doped doped regions may be n-doped and p-doped columnar portions of a charge compensation structure, wherein the amount of dopants in the n-doped columnar portions and the amount of dopants in the p-doped columnar portions can be adjusted with high precision (e.g., precision higher than a threshold precision).

Along a horizontal line through one of the first doped regions and through an adjoining (e.g., directly adjoining) one of the second doped regions, an integrated donor density may deviate from a half of a sum of the integrated donor density and an integrated acceptor density along the same line by at most 20%, or at most 10%. For example, at least along one horizontal line through one of the first doped regions and an adjoining (e.g., directly adjoining) one of the second doped regions at a predefined distance to the first surface, the integrated acceptor density may deviate from a half of a sum of the integrated donor density and the integrated acceptor density along the same line by at most 1%.

According to an embodiment, after implanting the dopants, an epitaxial layer may be formed on the first surface of the semiconductor body. The epitaxial layer may form part of the semiconductor body, wherein after forming the epitaxial layer an exposed top surface of the epitaxial layer forms the first surface of the semiconductor body. Doped regions of functional elements may be formed in the epitaxial layer. The functional elements may include a Schottky diode or transistor cells, by way of example.

According to an embodiment, the process of forming a first hard mask, implanting first dopants through first openings in the first hard mask, implanting second dopants through second openings in the first hard mask, forming a second hard mask, implanting first dopants through third openings in the second hard mask and implanting second dopants through fourth openings in the second hard mask may be repeated, wherein further doped regions may be formed in the epitaxial layer.

The process of forming an epitaxial layer and forming doped structures in the epitaxial layer using complementary hard masks may be repeated several times. The method may facilitate the formation of doped structures with a vertical extension greater than a maximum implant depth even in materials in which dopant atoms have low diffusion coefficients (e.g., a diffusion coefficient lower than a threshold diffusion coefficient).

An embodiment refers to a semiconductor device, e.g. a power semiconductor device such as an IGBT, an MOSFET, a Schottky diode, or an MGD (MOS gated diode), e.g., an SiC-MOSFET of an SiC Schottky diode. The semiconductor device may include stripe-shaped first doped regions of a first conductivity type and stripe-shaped second doped regions of a complementary second conductivity type. Longitudinal axes of the first and second doped regions may run parallel to a horizontal first direction, i.e. parallel to the x-axis. The first doped regions and the second doped regions alternate along a horizontal second direction orthogonal to the first direction, i.e. along the y-axis. The first and second doped regions between the two outermost ones of the first and second doped regions have a first width extension. The outermost ones of the first and second doped regions have a second width extension. The second width extension may be in a range from 25% to 75%, e.g. in a range from 45% to 55% of the first width extension.

The ratio between the first width extension and the second width extension may depend on the dopant density in the first and second doped regions. For example, along a line parallel to the second direction through one of the outermost ones of the first and second doped regions and the adjoining (e.g., directly adjoining) half of the adjoining first or second doped region, an integrated donor density may deviate from a half of a sum of the integrated donor density and an integrated acceptor density by at most 20%, e.g., at most 10%.

According to an embodiment, along a line parallel to the second direction through one of the first doped regions and through an adjoining (e.g., directly adjoining) one of the second doped regions an integrated donor density may deviate from a half of a sum of the integrated donor density and an integrated acceptor density by at most 20%.

An embodiment refers to a silicon carbide device, e.g. a SiC power semiconductor device such as an SiC IGBT, SiC MOSFET, SiC Schottky diode, or SiC MGD. The silicon carbide device may include stripe-shaped first doped regions of a first conductivity type and stripe-shaped second doped regions of a complementary second conductivity type, wherein the first and second doped regions may be formed in a silicon carbide body. Horizontal longitudinal axes of the first and second doped regions run parallel to a horizontal first direction (x-axis). The first doped regions and the second doped regions alternate along a horizontal second direction (y-axis) orthogonal to the first direction. The first and second doped regions have a first width extension along the second direction. Along a line parallel to the second direction through one of the first doped regions and/or along a line parallel to the second direction through one of the second doped regions: a) across at least 75% of the first width extension, a dopant concentration deviates by not more than 15% from a mean dopant concentration in the respective doped region, b) a maximum dopant concentration deviates by not more than 20% from the mean dopant concentration in the doped region, and c) a position of the dopant concentration maximum deviates by not more than 10% of the first width extension from a lateral center of the doped region.

FIGS. 1A to 1F illustrate a method of manufacturing a semiconductor device with stripe-shaped doped regions. The illustrated manufacturing processes may be applied at wafer level. At wafer level, a semiconductor substrate, e.g. a semiconductor wafer, includes a plurality of chip areas arranged in lines and rows. Dicing streets (kerf lines) separate neighboring chip areas from each other. Each chip area represents a semiconductor body 100, which a dicing process along the dicing streets later separates from the other semiconductor bodies.

The semiconductor body 100 has a first surface 101 at a front side and a second surface opposite to the front side. The first surface 101 is a section of a front side surface of the semiconductor substrate. The second surface is a section of a back side surface of the semiconductor substrate. The first surface 101 and the second surface may extend parallel to each other, wherein the first surface 101 may be planar or ripped. In case of a ripped first surface 101, a mean plane through the ripped main surface 101 is considered as first surface 101 in the following for simplicity.

The semiconductor body 100 extends along a main extension plane in horizontal directions along the x-axis and the y-axis, which is orthogonal to the x-axis. The horizontal directions are also referred to as lateral directions in the following. In a vertical direction along the z-axis and perpendicular to the horizontal directions, the semiconductor body 100 has a thickness, which is small compared to the extension of the semiconductor body 100 along the main extension plane. A total thickness of the semiconductor body 100 between the first surface 101 and the second surface is related to a nominal blocking capability of the manufactured silicon carbide device and may be in the range of several hundred nm to several hundred μm.

The vertical direction may coincide with a main lattice direction of the semiconductor body 100 or may be tilted with respect to a main lattice direction by an off-axis angle, wherein the off-axis angle may be in a range from 2° to 8° in absolute value. For example, the off-axis angle may be about 4°.

The semiconductor body 100 or at least a portion of the semiconductor body 100 adjoining (e.g., directly adjoining) the first surface 101 may be lightly n doped, lightly p doped or approximately intrinsic. For example, the semiconductor body 100 may include a more heavily doped substrate portion and a more lightly doped epitaxial layer formed on the substrate portion. A first mask material is deposited on the first surface 101 and patterned in a photolithographic process to form a first hard mask 410.

FIG. 1A shows the first hard mask 410 on the first surface 101. The first hard mask 410 may be a homogenous structure from one material or may include two or more sublayers of different materials. The first hard mask 410 may include silicon oxide, siliconoxynitride, silicon nitride, amorphous carbon, amorphous silicon, polycrystalline silicon, diamond-like carbon and/or a metal oxide.

Stripe-shaped first openings 411 in the first hard mask 410 expose stripe-shaped first surface sections 601 and stripe-shaped second openings 412 expose stripe-shaped second surface sections 602 of the first surface 101. Longitudinal axes of the first openings 411 and the second openings 412 extend along the x-axis. First openings 411 and second openings 412 alternate along the y-axis. The first and second openings 411, 412 may have the same width along the y-axis.

A first auxiliary mask material is deposited and patterned in a photolithographic process to form a first auxiliary mask 430. Donator ions are implanted through openings in the first hard mask 410 exposed by the first auxiliary mask 430.

Figure 1B:
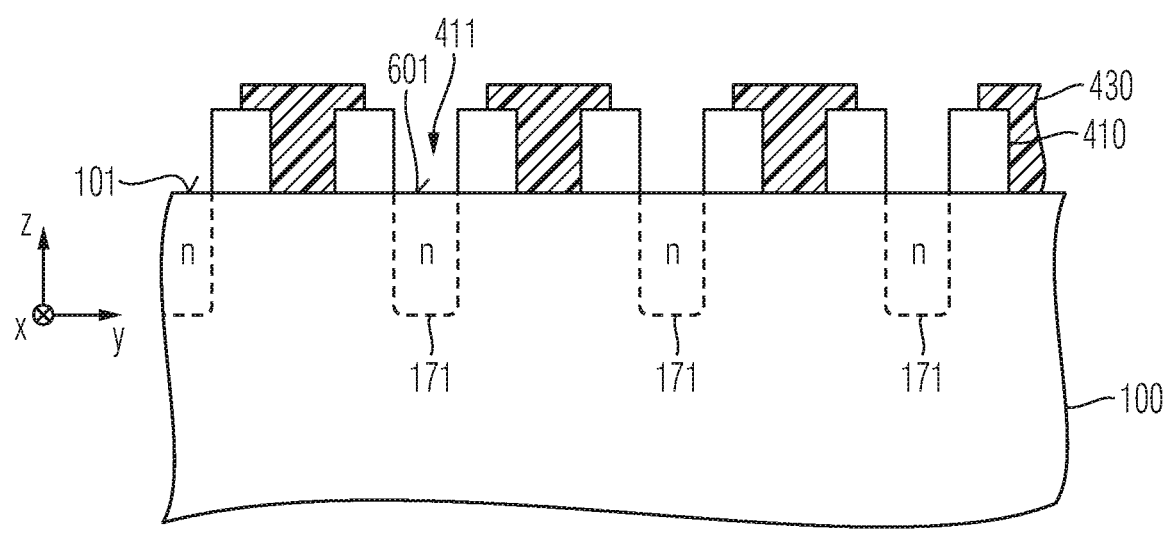

According to FIG. 1B the first auxiliary mask 430 fills the second openings 412 in the first hard mask 410 and covers the second surface sections 602 shown in FIG. 1A. Openings in the first auxiliary mask 430 expose the first openings 411 in the first hard mask 410 and the first surface sections 601. The first auxiliary mask 430 may consist of and/or may include a positive photoresist material or a negative photoresist material. First implant zones 171 below (e.g., directly below) the first surface sections 601 contain the donator ions implanted through the first surface sections 601.

In case the semiconductor material of the semiconductor body 100 is SiC, a vertical dopant distribution within the first implant zones 171 may be to a high degree uniform ("box-shaped") (e.g., a uniformity of the vertical dopant distribution within the first implant zones 171 may be higher than a threshold uniformity). For example, an energy distribution of the dopant ions may be spread by passing the dopant ions through an energy filter prior to entering the semiconductor body, the implant angle may be varied for the various implant passes and/or the acceleration energy may be varied for the various implant passes.

The first auxiliary mask 430 is removed. A second auxiliary mask material is deposited and patterned in a photolithographic process to form a second auxiliary mask 440. Acceptor ions are implanted through openings in the first hard mask 410 exposed by the second auxiliary mask 440.

Figure 1C:
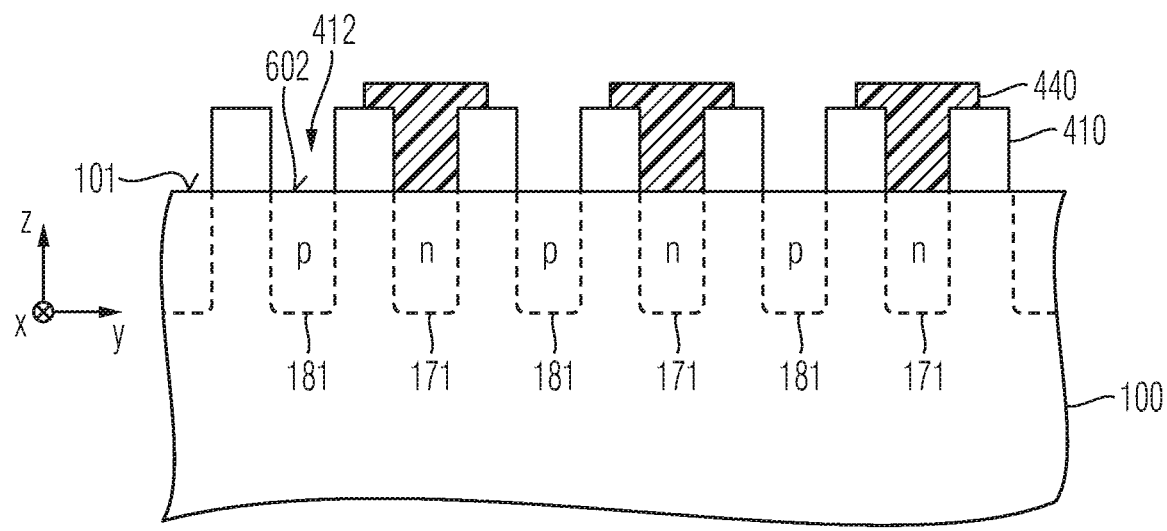

As illustrated in FIG. 1C, the second auxiliary mask 440 fills the first openings 411 in the first hard mask 410 and covers the first surface sections 601 shown in FIG. 1B. Openings in the second auxiliary mask 440 expose the second openings 412 in the first hard mask 410 and the second surface sections 602. The second auxiliary mask 440 may consist of and/or include a positive photoresist material or a negative photoresist material. Second implant zones 181 below (e.g., directly below) the second surface sections 602 contain the acceptor ions implanted through the second surface sections 602. The vertical dopant distribution within the second implant zones 181 may be box-shaped.

A second hard mask 420 is formed that replaces the first hard mask 410. The second hard mask 420 is at least approximately complementary to the first hard mask 410. In other words, the second hard mask 420 and the first hard mask 410 are inverted masks. The mask stripes of the second hard mask 420 are formed only or at least predominantly at the position of the first and second openings 411, 412 in the first hard mask 410. Third and fourth openings 421, 422 in the second hard mask 420 are formed only or at least predominantly at the position of the mask stripes of the first hard mask 410. A virtual combination of the first hard mask 410 and the second hard mask 420 may form a contiguous layer.

Figure 1D:
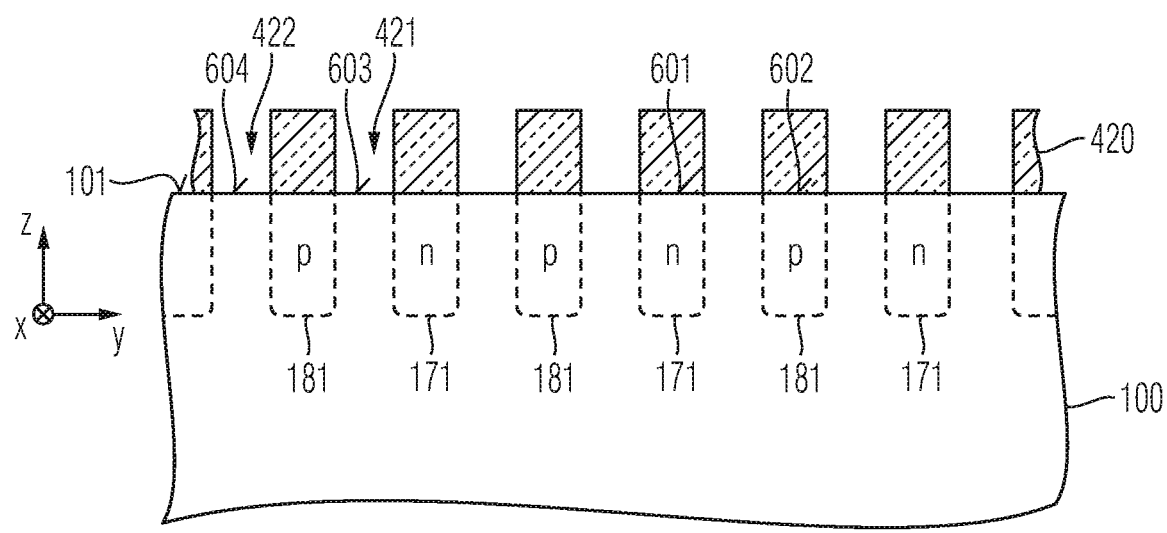

In the embodiment as illustrated in FIG. 1D the second hard mask 420 completely covers the first and second surface sections 601, 602 shown if FIG. 1A. The first openings 421 in the second hard mask 420 expose third surface sections 603 of the first surface 101, and the second openings 422 expose fourth surface sections 604. The first openings 421 and the second openings 422 alternate along the y-axis. The third and fourth openings 421, 422 may have the same width along the y-axis.

The second hard mask 420 may be a homogenous structure from one material or may include two or more sublayers of different materials. The second hard mask 420 may include silicon oxide, siliconoxynitride, silicon nitride, amorphous carbon, amorphous silicon, polycrystalline silicon, diamond-like carbon and/or a metal oxide, by way of example.

The first hard mask 410 and the second hard mask 420 may differ in composition, e.g., may be formed from different materials with different (e.g., significantly different) etching properties. For example, one of the first hard mask 410 and the second hard mask may include and/or may consist of a silicon oxide. The other one of the first hard mask 410 and the second hard mask 420 may include and/or consist of polycrystalline silicon or a silicon nitride, e.g. $Si_3N_4$.

A third auxiliary mask material is deposited and patterned in a photolithographic process to form a third auxiliary mask 450. Donator ions are implanted through openings in the second hard mask 420 exposed by openings in the third auxiliary mask 450.

Figure 1E:
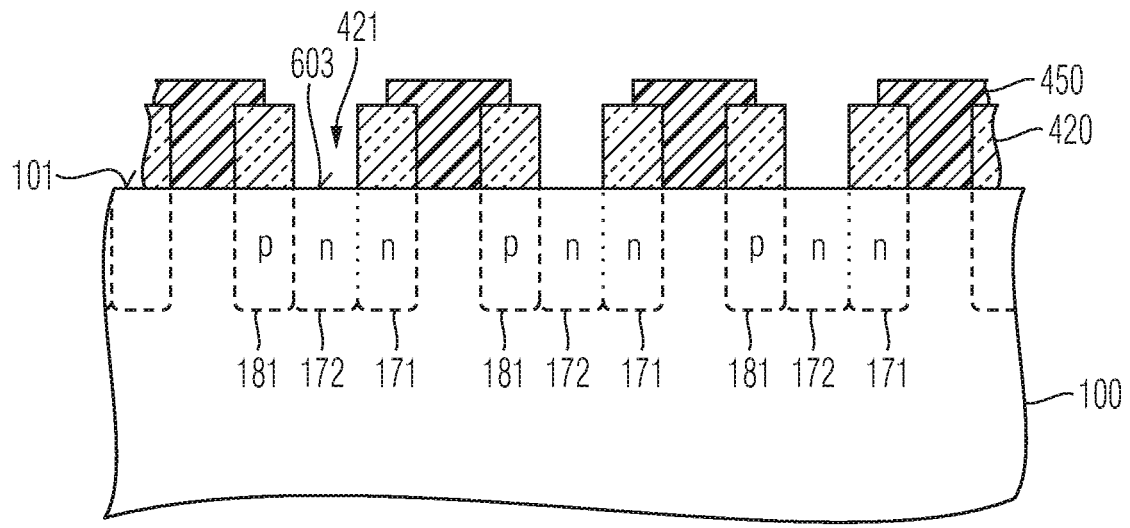

As illustrated in FIG. 1E the third auxiliary mask 450 fills the fourth openings 422 in the second hard mask 410 and covers the fourth surface sections 604 shown in FIG. 1D. Openings in the third auxiliary mask 450 expose the third openings 421 in the second hard mask 420 and the third surface sections 603. The third auxiliary mask 450 may consist of and/or include a positive photoresist material or a negative photoresist material. Further first implant zones 172 below (e.g., directly below) the third surface sections 603 contain the donator ions implanted through the third surface sections 603. The vertical dopant distributions within the further first implant zones 172 and the first implant zones 171 may be equal or at least approximately equal.

In the illustrated embodiment, the first implant zones 171 and the further first implant zones 172 are in contact (e.g., direct contact) with each other. According to other embodiments (not illustrated), the first implant zones 171 and the further first implant zones 172 may be separated from each other (e.g., slightly separated from each other) or may overlap each other (e.g., slightly overlap each other).

Further in the illustrated embodiment, the further implant zones 172 and the second implant zones 181 are in contact (e.g., direct contact) with each other. According to other embodiments (not illustrated), the further first implant zones 172 and the second implant zones 181 may be separated from each other (e.g., slightly separated from each other) or may overlap each other (e.g., slightly overlap each other).

The third auxiliary mask 450 is removed. A fourth auxiliary mask material is deposited and patterned in a photolithographic process to form a fourth auxiliary mask 460. Acceptor ions are implanted through openings in the second hard mask 420 exposed by openings in the fourth auxiliary mask 460. A heat treatment may activate the implanted donator and acceptor ions.

Figure 1F:
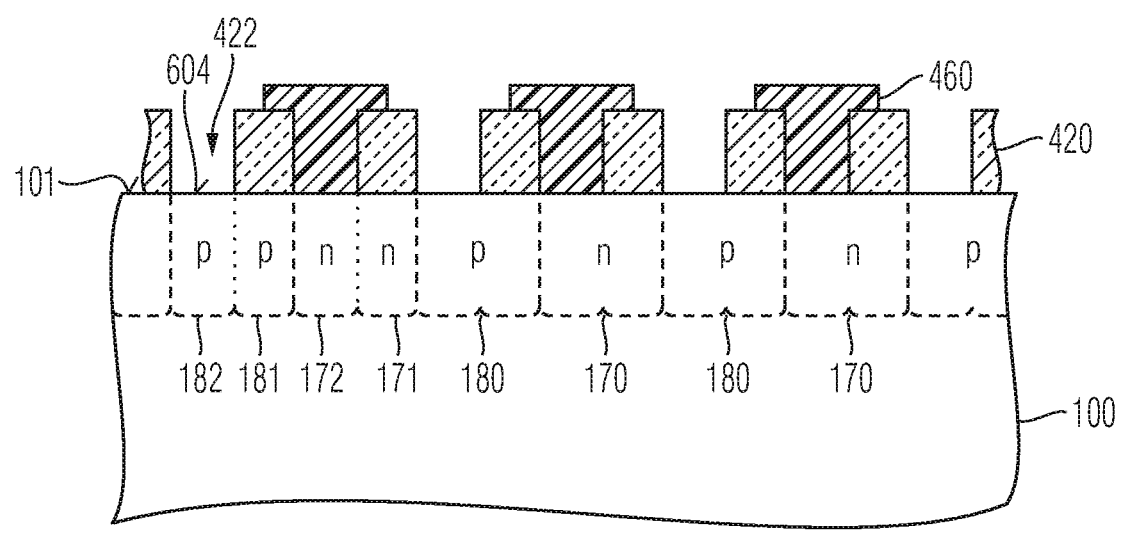

As illustrated in FIG. 1F the fourth auxiliary mask 460 fills the third openings 421 in the second hard mask 420 and covers the third surface sections 603 shown in FIG. 1E. Openings in the fourth auxiliary mask 460 expose the fourth openings 422 in the second hard mask 420 and the fourth surface sections 604. The fourth auxiliary mask 460 may consist of and/or include a positive photoresist material or a negative photoresist material. Further second implant zones 182 below (e.g., directly below) the fourth surface sections 604 contain the acceptor ions implanted through the fourth surface sections 604. The vertical dopant distributions within the further second implant zones 182 and the second implant zones 181 may be equal or at least approximately equal.

In the illustrated embodiment, the second implant zones 181 and the further second implant zones 182 adjoin (e.g., directly adjoin) each other. According to other embodiments (not illustrated), the second implant zones 181 and the further second implant zones 182 may be separated from each other (e.g., slightly separated from each other) or may overlap each other (e.g., slightly overlap each other).

Further in the illustrated embodiment, the further second implant zones 182 and the first implant zones 171 adjoin (e.g., directly adjoin) each other. According to other embodiments (not illustrated), the further second implant zones 182 and the first implant zones 171 may be separated from each other (e.g., slightly separated from each other) or may overlap each other (e.g., slightly overlap each other).

The activation of dopants forms first doped regions 170 including the first implant zones 171 and the further first implant zones 172 and forms second doped regions 180 including the second implant zones 181 and the further second implant zones 182.

Figure 2A:
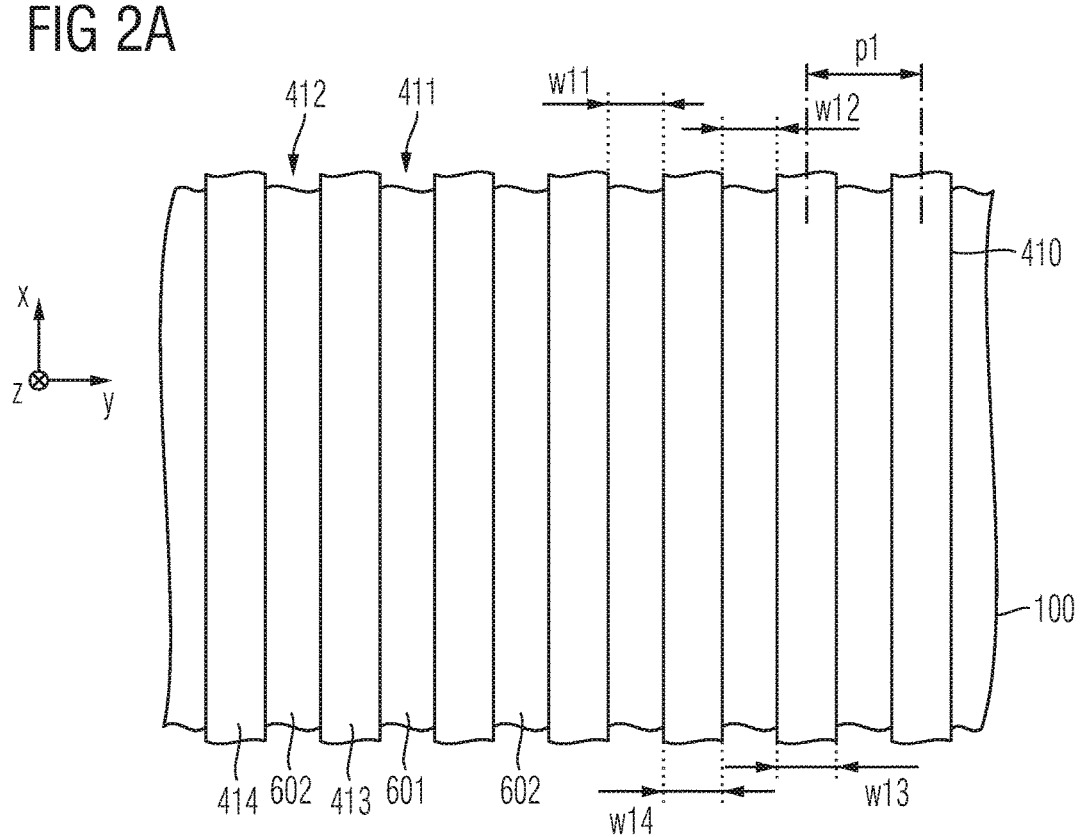
FIGS. 2A-2B show schematic plan views of a portion of a semiconductor body for illustrating a first hard mask and a second hard mask used in the method illustrated in FIGS. 1A-1F.

FIG. 2A shows a plan view of a first hard mask 410. The first hard mask 410 includes first mask stripes 413 and second mask stripes 414. The first and second mask stripes 413, 414 have a longitudinal extension parallel to the x-axis and alternate (e.g., strictly alternate) along the y-axis at a regular center-to-center distance p1. Between the first and second mask stripes 413, 414 the first hard mask 410 includes stripe-shaped first openings 411 and stripe-shaped second openings 412. The first and second openings 411, 412 have a longitudinal extension parallel to the x-axis and alternate (e.g., strictly alternate) along the y-axis at the center-to-center distance p1. The first openings 411 expose stripe-shaped first surface sections 601. The second openings 412 expose stripe-shaped second surface sections 602.

The first mask stripes 413 have a first mask stripe width w13. The second mask stripes 414 have a second mask stripe width w14. The first and second mask stripe width w13, w14 may be equal. The first openings 411 have a first opening width w11. The second openings 412 have a second opening width w12. The first and second opening widths w11, w12 may be equal.

Figure 2B:
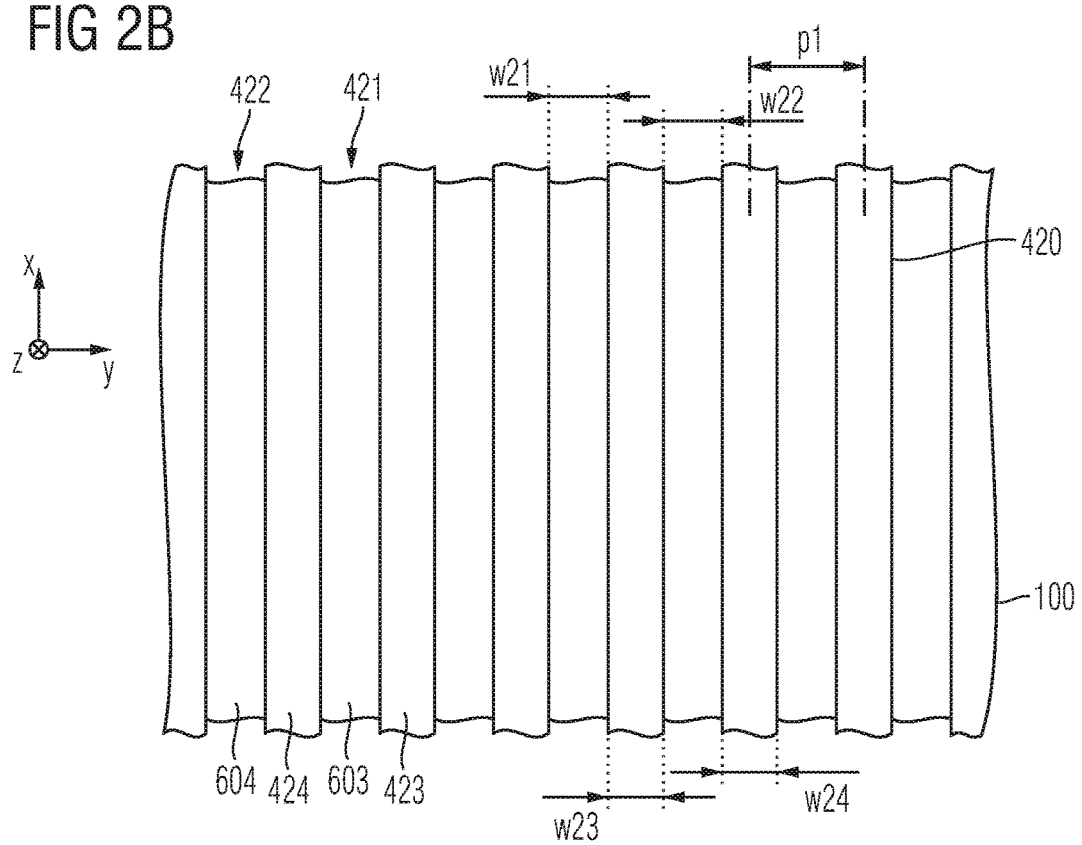

FIG. 2B shows a plan view of a second hard mask 420. The second hard mask 420 includes third mask stripes 423 and fourth mask stripes 424. The third and fourth mask stripes 423, 424 have a longitudinal extension parallel to the x-axis and alternate (e.g., strictly alternate) along the y-axis at the center-to-center distance p1.

The second hard mask 420 includes stripe-shaped third openings 421 and stripe-shaped fourth openings 422. The third and fourth openings 421, 422 have a longitudinal extension parallel to the x-axis and alternate (e.g., strictly alternate) along the y-axis at the center-to-center distance p1. The third openings 421 expose stripe-shaped third surface sections 603. The fourth openings 422 expose stripe-shaped fourth surface sections 604.

The third mask stripes 423 have a third mask stripe width w23. The fourth mask stripes 424 have a fourth mask stripe width w24. The third and fourth mask stripe widths w23, w24 may be equal. The third openings 421 have a third opening width w21. The fourth openings 422 have a second opening width w22. The third and fourth opening widths w21, w22 may be equal.

The first mask stripe width w13 shown in FIG. 2A is at least 80%, e.g. at least 90% of the third opening width w21 shown in FIG. 2B. The second mask stripe width w14 shown in FIG. 2A is at least 80%, e.g. at least 90% of the fourth opening width w22 shown in FIG. 2B. The third mask stripe width w23 shown in FIG. 2B is at least 80%, e.g. at least 90% of the first opening width w11 shown in FIG. 2A. The fourth mask stripe width w24 shown in FIG. 2B is at least 80%, e.g. at least 90% of the second opening width w12 shown in FIG. 2A.

Figure 3A:
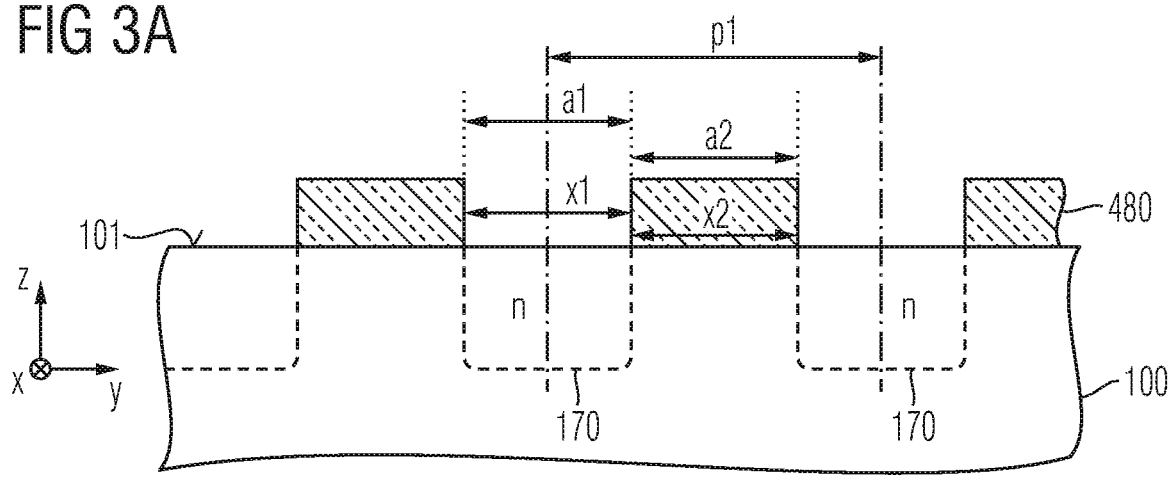
FIGS. 3A-3C show schematic vertical cross-sectional views of semiconductor body portions for discussing background useful for understanding of the embodiments.
Figure 3B:
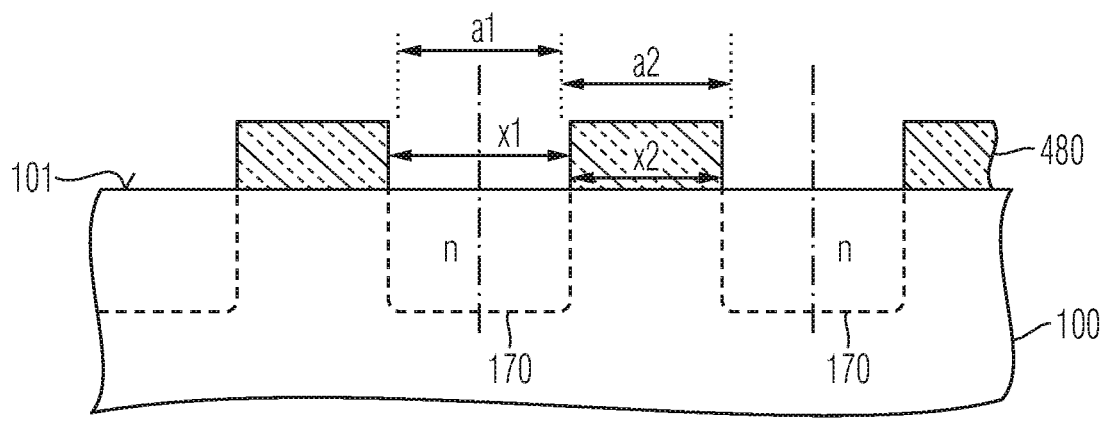
Figure 3C:
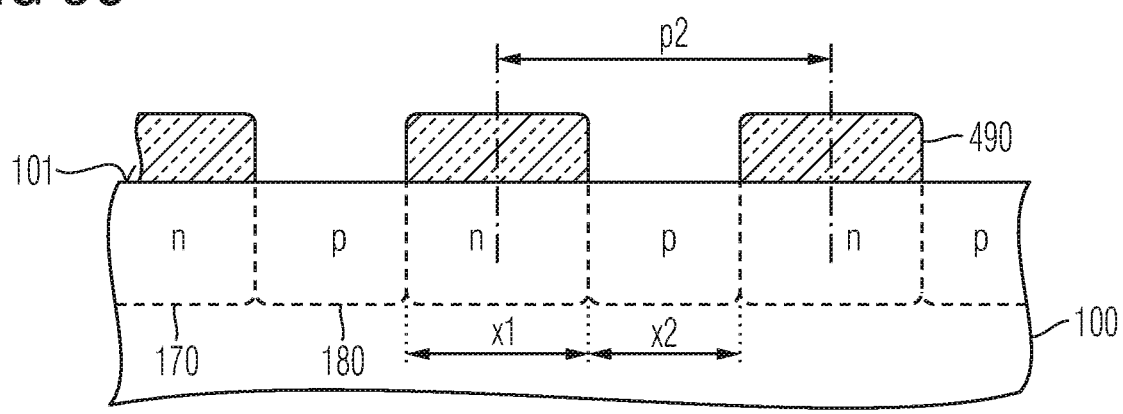

FIG. 3A to FIG. 3C refer to a comparative example using two complementary comparative hard masks 480, 490 for defining the lateral extensions of the n doped regions and p doped regions of a compensation structure. For simplicity, a target width a1 for n doped regions 170 and a target width a2 for p doped regions are equal.

In FIG. 3A the actual width x1 of the mask openings of the first comparative hard mask 480 is equal to the target width a1 and the actual width x2 of the mask stripes of the first comparative hard mask 480 is equal to the target width a2. Provided that the second comparative hard mask is complementary to the first comparative hard mask 480, the n doped regions and the p doped regions of the compensation structure have the same width. The degree of compensation depends on (e.g., only depends on) the ratio of the implant doses for the acceptors and for the donors.

In FIG. 3B the actual width x1 of the mask openings of the first comparative hard mask 480 is greater than the target width a1 and the actual width x2 of the mask stripes of the first comparative hard mask 480 is smaller than the target width a2.

FIG. 3C shows a second comparative hard mask 490, which is complementary to the first comparative hard mask 480 in FIG. 3B. After implantation of the acceptor and donator ions, the n doped regions 170, which result from ion implantation through the openings in the first comparative mask 480 shown in FIG. 3B, are wider than the p doped regions 180, which result from ion implantation through the openings in the second comparative mask 490. A center-to-center distance p2 between doped regions of the same conductivity type is equal to the first center-to-center distance p1 between neighboring mask stripes in the first and second comparative masks 480, 490.

The degree of compensation depends from both the ratio of the implant doses and on the deviation between actual width x1 and target width a1 of the openings in the first comparative mask 480. In addition, the absolute doping in each doped region, i.e. the total number of dopants per doped region, depends on mask variations.

Figure 4A:
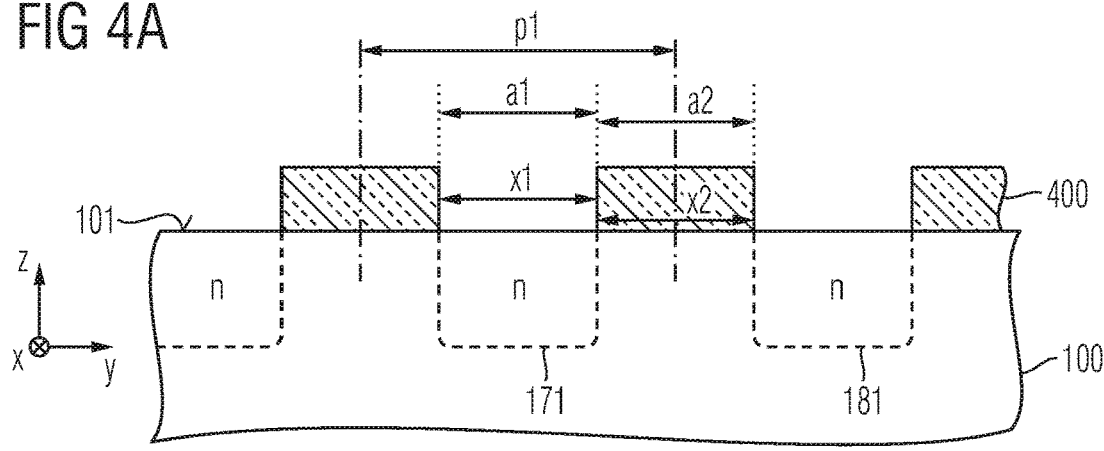
FIGS. 4A-4C show schematic vertical cross-sectional views of semiconductor body portions for discussing effects of the embodiments.
Figure 4B:
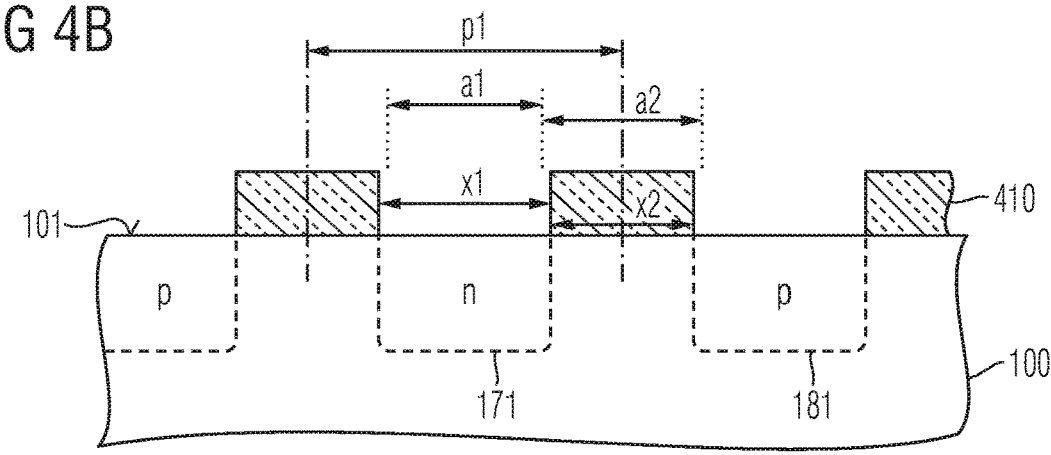
Figure 4C:
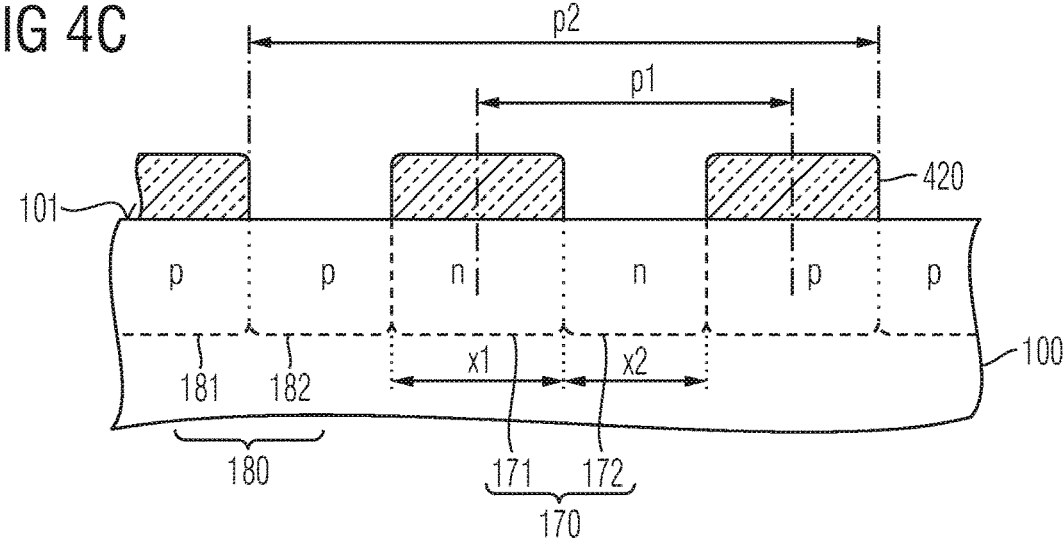

FIG. 4A to FIG. 4C illustrate the effect of using two complementary hard masks in combination with four auxiliary masks as described with reference to FIG. 1A to FIG. 1F. Again, a target width a1 for n doped regions 170 and a target width a2 for p doped regions are assumed to be equal for simplicity.

In FIG. 4A the actual width x1 of the mask openings of the first hard mask 410 is equal to the target width a1 and the actual width x2 of the mask stripes of the first hard mask 410 is equal to the target width a2. First and second implant zones 171, 181 of different conductivity type alternate along the y-axis. Provided that the second hard mask is complementary to the first hard mask 410, all doped regions of the compensation structure have the same width.

In FIG. 4B the actual width x1 of the mask openings of the first hard mask 410 is greater than the target width a1 and the actual width x2 of the mask stripes of the first hard mask 410 is smaller than the target width a2.

FIG. 4C shows the second hard mask 420, which is complementary to the first hard mask 410 in FIG. 4B. The center-to-center distance p1 between neighboring mask stripes is the same for the first hard mask 410 in FIG. 4B and the second hard mask 420 in FIG. 4C. The openings in the second hard mask 420 are narrower than the target width a1 by the same amount as the openings in the first hard mask 410 are wider than the target width a1. Since each n doped region 170 results from a first implant through an opening in the first hard mask 410 of FIG. 4B and from a second implant through an opening in the second hard mask 420 of FIG. 4C, and since the width deviations of the openings in both hard masks cancel each other out, the total width of both the n doped regions and the p doped regions does not or only to a low degree depend on mask variations. A center-to-center distance p2 between doped regions of the same conductivity type is twice the first center-to-center distance p1 between neighboring mask stripes in the first and second hard masks 410, 420. The width of the n doped regions 170 and the width of the p doped regions 180 are equal to the center-to-center distance p1 between the mask stripes of the first and second hard masks 410, 420.

For example, variations of the widths of the openings across a semiconductor substrate have no or approximately no impact on the amount of dopant atoms in the doped regions.

The degree of compensation depends on (e.g., depends only on) the ratio of the well-controllable implant doses. In addition, mask variations have no or approximately no impact on the absolute doping in the doped regions (number of dopants per doped region).

The diagram shown in FIG. 5 shows compensation parabolas 700, 701, 702 for a semiconductor device with a nominal voltage breakdown capability VBR. Compensation parabola 700 refers to a predefined nominal absolute doping and is selected such that for ensuring the nominal voltage breakdown capability VBR, the admissible deviation for the p-load error is ±3.6%. Compensation parabolas 701, 702 refer to an absolute doping of 101% and 102% of the predefined nominal absolute doping. With increasing absolute doping the compensation parabola shifts downwards and the admissible tolerance window for the p-load shrinks. Higher nominal absolute doping results in a lower on-state resistance. But, in some examples, for ensuring a sufficiently wide tolerance window for the p-load, the predefined nominal absolute doping must be sufficiently low (e.g., lower than a threshold).

The process as described with reference to FIGS. 1A to 1F may eliminate main contributions to the process windows for absolute doping and p-load. The process windows can be reduced (e.g., significantly reduced) without loss of yield. For example, for the same yield the absolute doping can be selected higher and a lower on-state resistance can be achieved than with the comparative process described with reference to FIGS. 3A to 3C.

Figure 6A:
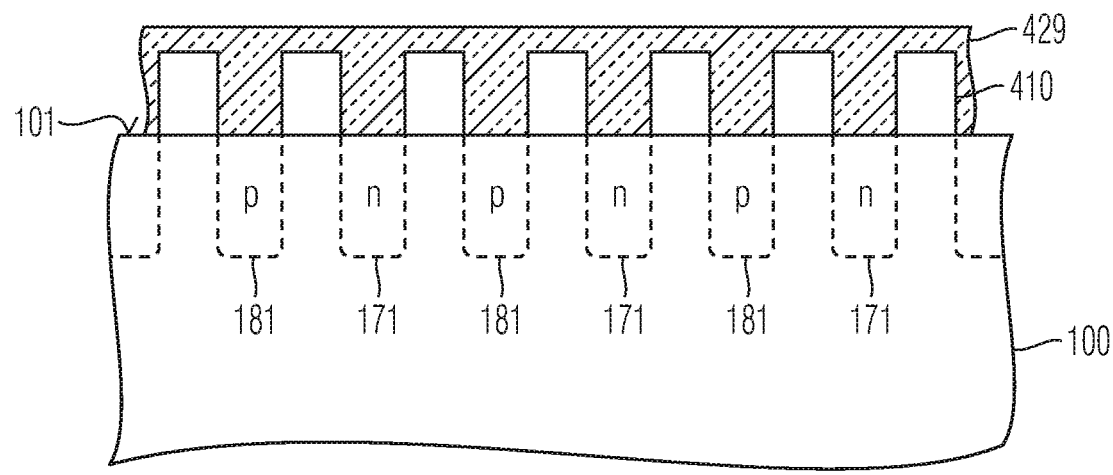
FIGS. 6A-6C show schematic vertical cross-sectional views of a portion of a semiconductor body for illustrating a method of manufacturing a semiconductor device according to an embodiment concerning a second hard mask formed self-aligned to the first hard mask.
Figure 6B:
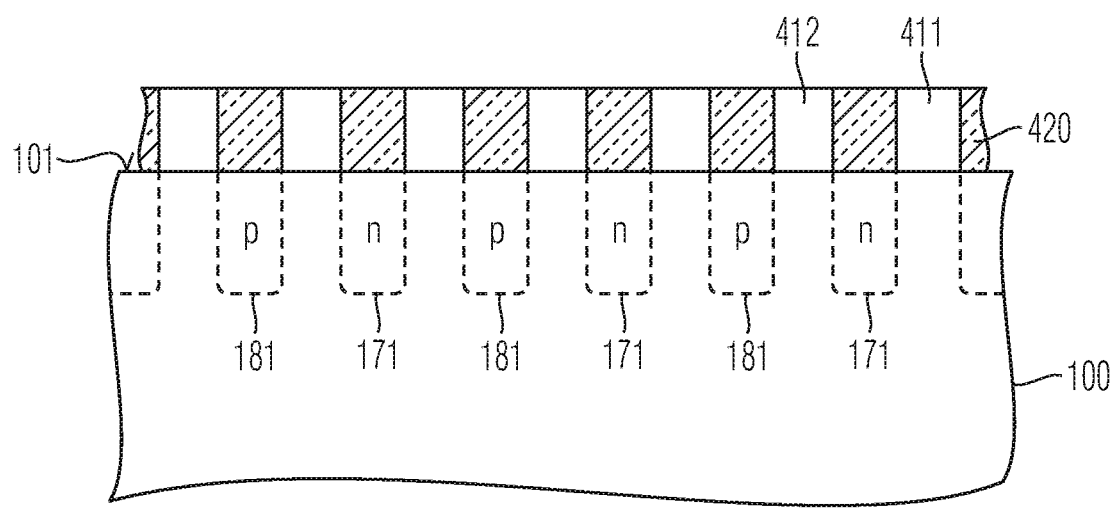
Figure 6C:
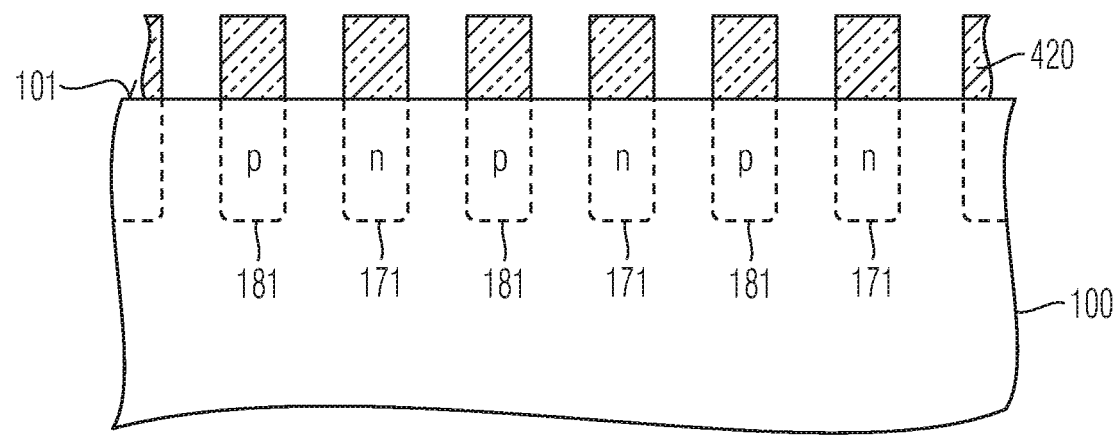

FIGS. 6A to 6C show a self-aligned formation of the second hard mask 420. A first hard mask 410 is used for defining first implant zones 171 and second implant zones 181 as described with reference to FIGS. 1A to 1C. The first hard mask 410 is formed from a first mask material. A second mask material 429 is deposited.

FIG. 6A shows the second mask material 429 covering the first hard mask 410 and filling the openings in the first hard mask 410. Portions of the second mask material 429 deposited outside the openings of the first hard mask 410 are removed. Removal of the second mask material 429 from above the first hard mask 410 may include chemical mechanical polishing (CMP), wet etching and/or dry etching, e.g. a plasma process.

FIG. 6B shows a second hard mask 420 including the residual portions of the second mask material 429 of FIG. 6A between the mask stripes 411, 412 of the first hard mask 410 of FIG. 6A. Removal of the second mask material 429 from above the first hard mask 410 exposes the top surface of the mask stripes of the first hard mask 410. Then the first mask material forming the first hard mask 410 is removed with high selectivity (e.g., selectivity higher than a threshold selectivity) against the second mask material. For example, a wet etch process (e.g., a highly selective wet etch process) may selectively remove the first mask material.

FIG. 6C shows the second hard mask 420 after removal of the first hard mask 410. Mask stripes of the second hard mask 420 are selectively formed on surface sections above (e.g., directly above) the first implant zones 171 and the second implant zones 181. Processing may proceed as described with reference to FIG. 1E.

Figure 7A:
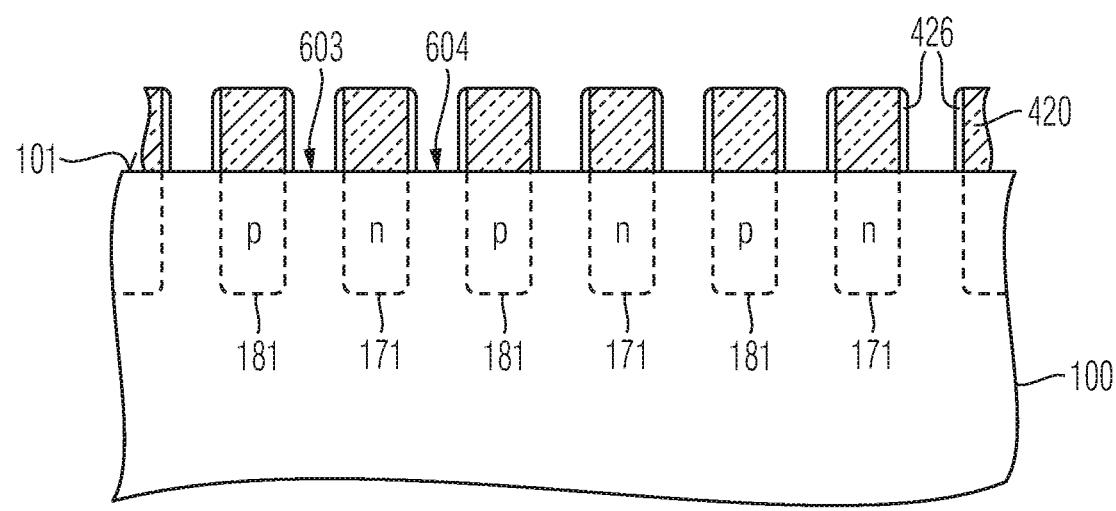
FIGS. 7A-7B show schematic vertical cross-sectional views of a portion of a semiconductor body for illustrating a method of manufacturing a semiconductor device according to an embodiment concerning formation of mask spacers along sidewalls of openings in the second hard mask.
Figure 7B:
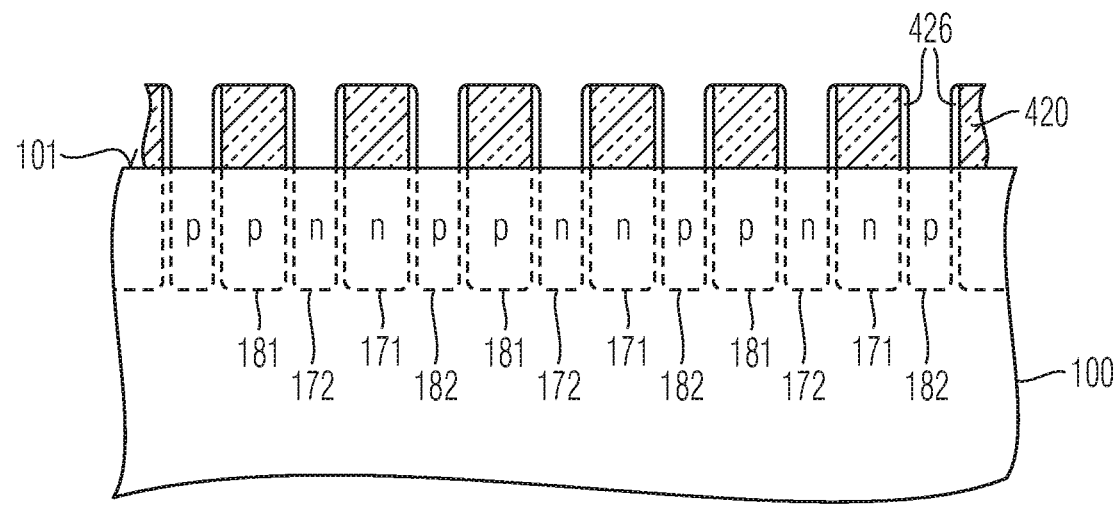

FIGS. 7A to 7B show formation and effect of sidewall spacers 426 that increase a lateral distance between the first and second implant zones 171, 181 defined by the first hard mask 410 on the one hand and the further first and second implant zones 172, 182 defined by the second hard mask 420 on the other hand.

After forming a second hard mask 420 as described with reference to FIG. 1D and/or FIG. 6C and prior to implanting dopants through openings in the second hard mask 420, a conformal mask layer (e.g., a highly conformal mask layer) is deposited that covers the second hard mask 420, the third surface sections 603, the fourth surface sections 604 and sidewalls of the openings in the second hard mask 420. An anisotropic etch process selectively removes horizontal portions of the conformal mask liner.

FIG. 7A shows that residuals of the conformal mask liner form sidewall spacers 426 lining the openings in the second hard mask 420. The sidewall spacers 426 include and/or consist of a material against which the third and fourth auxiliary masks as described with reference to FIGS. 1E and 1F can be removed at high selectivity (e.g., selectivity higher than a threshold selectivity). The sidewall spacers 426 and the second hard mask 420 may be provided from different materials or may include materials of equal or similar composition. Dopant ions may be implanted through the lined mask openings as described with reference to FIGS. 1E and 1F.

As shown in FIG. 7B, the thickness of the conformal mask liner determines a lateral distance between the first and second implant zones 171, 181 on the one hand and the further first and second implant zones 172, 182 on the other hand. A lateral overlap between neighboring zones by inter-diffusion and/or lateral straggling of implanted dopant ions, e.g. as a result of the "ducktail effect" may be reduced.

Figure 8:
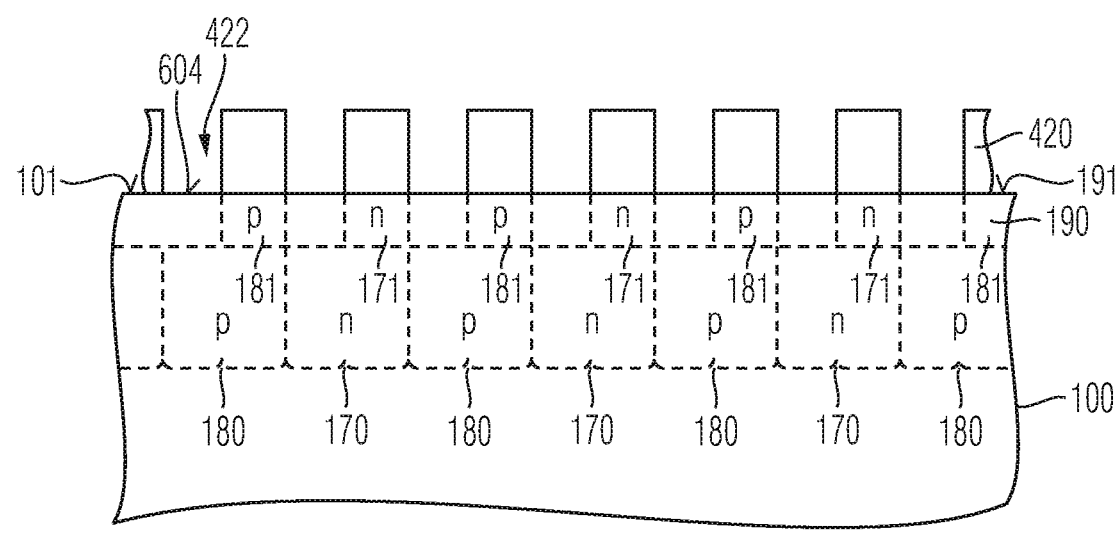
FIG. 8 shows a schematic vertical cross-sectional view of a portion of a semiconductor body for illustrating a method of manufacturing a semiconductor device according to an embodiment concerning growth of an epitaxial layer after removal of the second hard mask.

FIG. 8 shows a compensation structure including first doped regions 170 and second doped regions 180, which may be formed by the method as described with respect to FIGS. 1A to 1F. An epitaxial layer 190 is formed on the front side of the semiconductor body 100 of FIG. 1F. The exposed top surface 191 of the epitaxial layer 190 forms the new first surface 101 at the front side of the semiconductor body 100. In the epitaxial layer 190 doped regions of transistor cells may be formed. Alternatively, a process as described with reference to FIGS. 1A to 1F may be repeated and forms additional implant zones of both conductivity types in the epitaxial layer 190. The previously formed implant zones and the additional implant zone in the epitaxial layer may be vertically stacked. The process sequence of forming an epitaxial layer and forming additional implant zones of both conductivity types may be repeated several times to form a compensation structures with predefined total vertical extension.

Figure 9A:
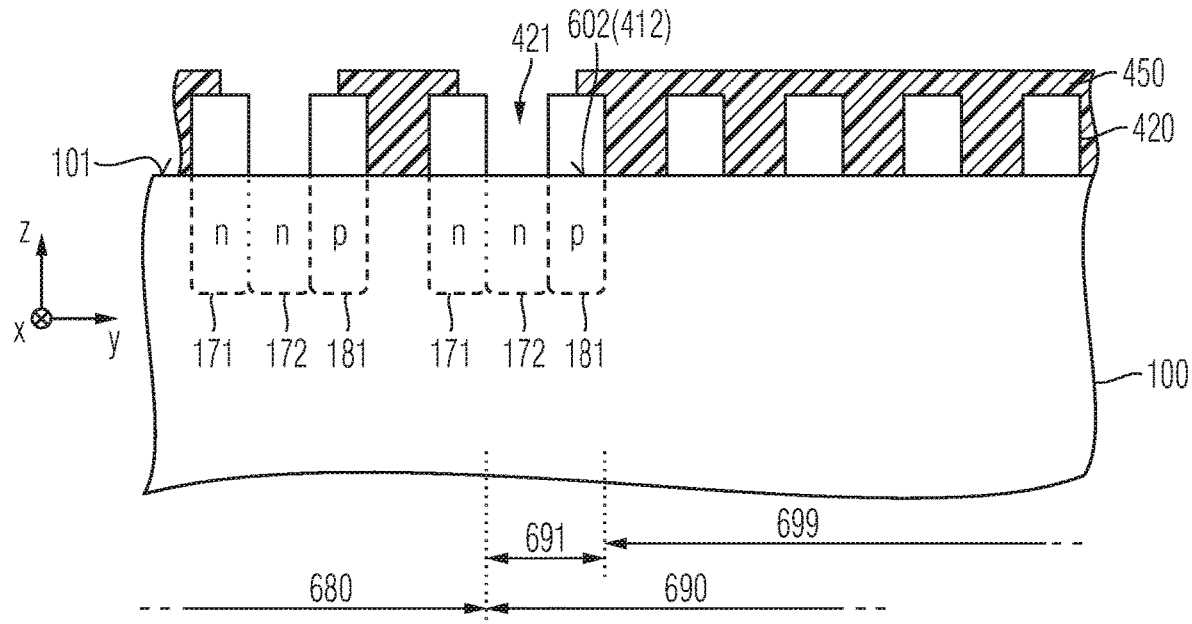
FIGS. 9A-9B show schematic vertical cross-sectional views of a portion of a semiconductor body for illustrating a method of manufacturing a semiconductor device according to an embodiment concerning a transition region between a central region and a peripheral region.
Figure 9B:
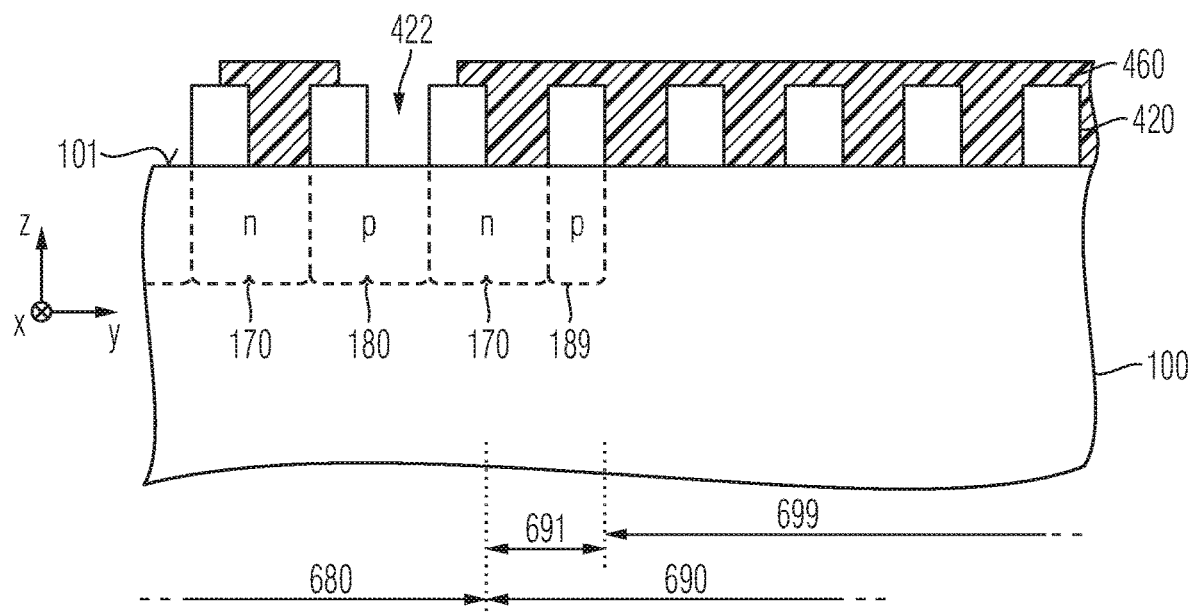

FIGS. 9A to 9B refer to a transition region 691 between a central region 680 and a peripheral region 699 of a semiconductor body 100. In the central region 680 a regular pattern of oppositely doped regions is formed. The peripheral region 699 surrounds the central region 680 and may extend along a lateral outer surface of the semiconductor body 100. The transition region 691 and the peripheral region 699 form a termination region 690 separating the central region 680 and the lateral outer surface along the y-axis. The transition region 691 separates the central region 680 and the peripheral region 699 along the y-axis.

In the central region 680 active electric contacts are formed on both the front side and the back side of the semiconductor body 100, wherein in the on-state or forward mode of the semiconductor device load current or forward current flows through the active electric contacts. In the termination region 690 active electrical contacts are absent at least at the front side or at the back side.

In the process as described with reference to FIGS. 1A to 1F, the pattern of the two hard masks may extend along the y-axis across the central region 680 and the termination region 690. Each of the auxiliary masks 430, 440, 450, 460 is formed to completely cover and/or fill the hard mask openings in the peripheral region 699. The inner edges of the auxiliary masks 430, 440, 450, 460 oriented to the central region 680 are adjusted such that a conductivity type of dopants implanted through an outermost one of the first, second, third, and fourth openings 411, 412, 421, 422 is complementary to a conductivity type of dopants implanted through a second outermost one of the first, second, third, and fourth openings 411, 412, 421, 422.

According to FIG. 9B the transition region 691 includes one outwardly oriented half of the second outermost (n) doped region 170 resulting from two implant zones 171, 172 shown in FIG. 9A and includes one (p) doped outermost doped region 189 resulting from one single implant zone 181 shown in FIG. 9A. The doped regions in the transition region 691 may completely compensate each other or may compensate to a predefined degree. Charge compensation can be assured at the edge of a charge compensation structure without additional process steps simply by adjusting the edges of the auxiliary masks accordingly.

Figure 10A:
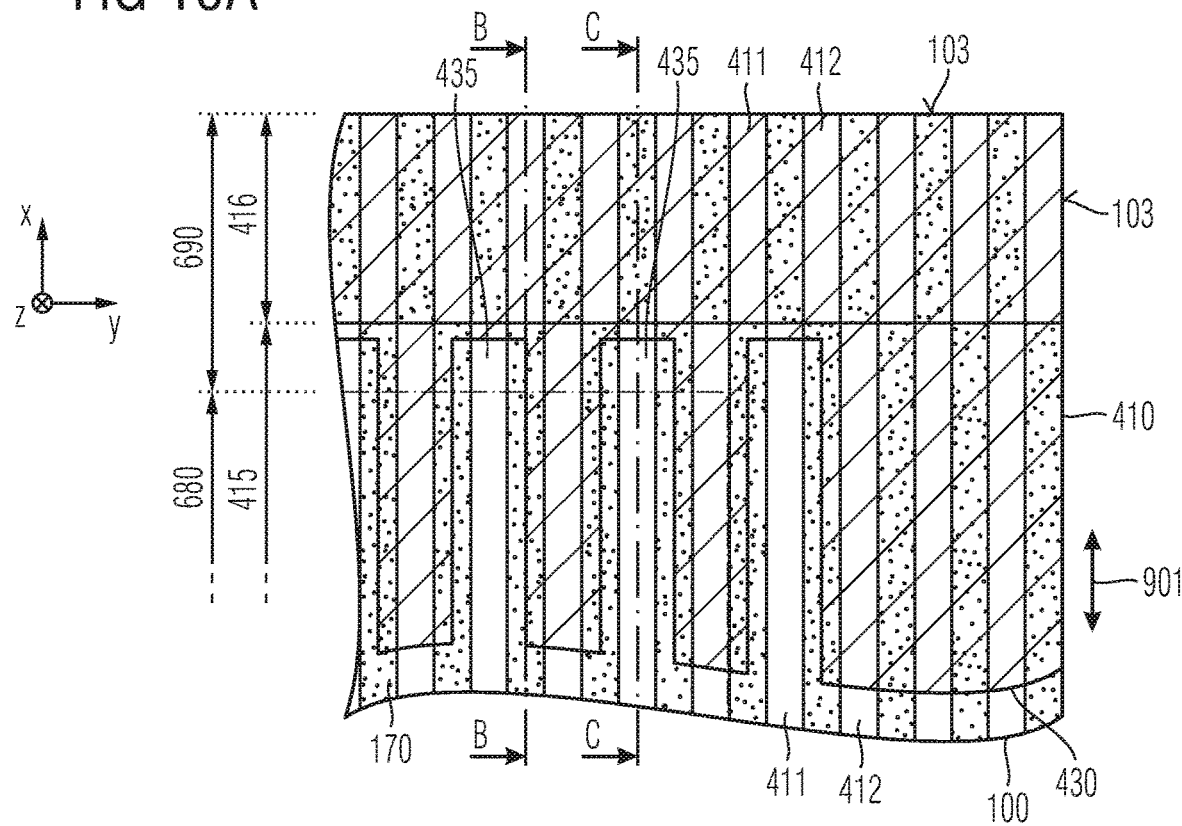
FIGS. 10A-10C show a schematic plan view and two parallel vertical cross-sectional views of a portion of a semiconductor body for illustrating a method of manufacturing a semiconductor device according to an embodiment.
Figure 10B:
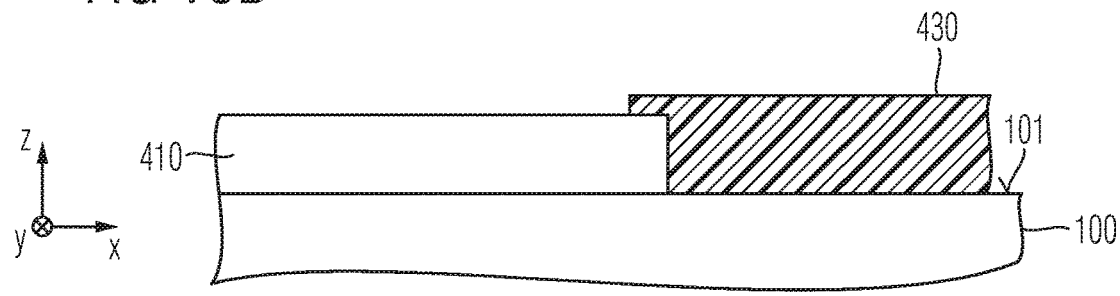
Figure 10C:
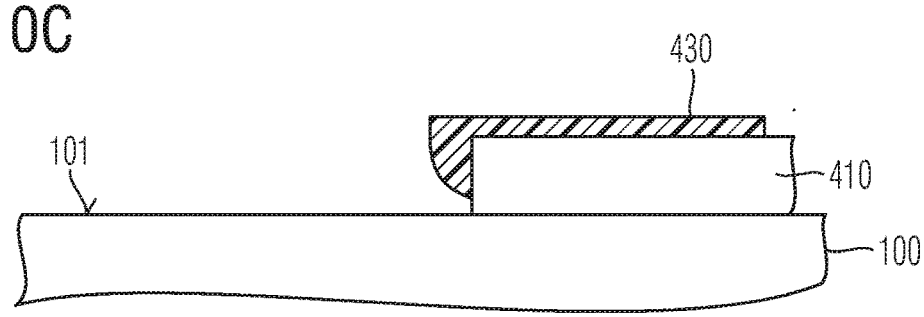

FIGS. 10A to 10C refer to the formation of the portions of the termination region 690 adjoining the central region 680 along the x-axis.

In FIG. 10A the illustrated first hard mask 410 includes mask stripes indicated by dots. The first hard mask 410 includes a central mask section 415 and a peripheral mask section 416. The central mask section 415 and the peripheral mask section 416 are arranged along the x-axis. The peripheral mask section 416 may include two sub-portions on opposite sides of the central mask section 415, wherein each sub-portion is provided between the central mask section 415 and the lateral outer surface 103. The central mask section 415 is formed in the central region 680. Along the x-axis the central mask section 415 may extend into the termination region 690.

The mask stripes of the central mask section 415 and the peripheral mask sections 416 are laterally shifted to each other by half of the lateral center-to-center distance such that the mask stripes of the peripheral mask sections 416 terminate the first and second openings 411, 412 in the central mask section 415 along the x-axis and such that the mask stripes of the central mask section 415 terminate the first and second openings 411, 412 in the peripheral mask section 416.

FIG. 10A further shows a first auxiliary mask 430 indicated by thin oblique hatching lines. The first auxiliary mask 430 completely covers the peripheral mask section 416 and completely covers the portion of the termination region 690, which separates the central region 680 and the lateral outer surface 103 along the y-axis. In the remaining portion of the central mask section 415, the first auxiliary mask 430 covers and/or fills the second mask openings 412. Openings 435 in the first auxiliary mask 430 expose the first mask openings 411.

FIG. 10B shows a longitudinal vertical cross-section along a mask stripe of the first hard mask 410. The first auxiliary mask 430 covers the vertical end face of the mask stripe and may overlap to some degree the mask stripe.

FIG. 10C shows a longitudinal vertical cross-section along a first opening 411 of the first hard mask 410. The first auxiliary mask 430 may be formed from a negative photoresist material. Exposure and, if applicable, curing hardens, e.g. polymerizes, the exposed portions of the negative photoresist material starting from the top surface.

FIGS. 1A-1F, 2A-2B, 4A-4C, 6A-6C, 7A-7B, 8, 9A-9B, and 10A-10C show exemplary embodiments of methods of manufacturing a semiconductor device. The semiconductor device may be a semiconductor device as described herein, for example in connection with the embodiments described with reference to FIGS. 11, 12, 13A-13B, and 14. Vice versa, a semiconductor device described in the following figures may be manufactured with a method as described in connection with the embodiments of FIGS. 1A-1F, 2A-2B, 4A-4C, 6A-6C, 7A-7B, 8, 9A-9B, and 10A-10C.

Figure 11:
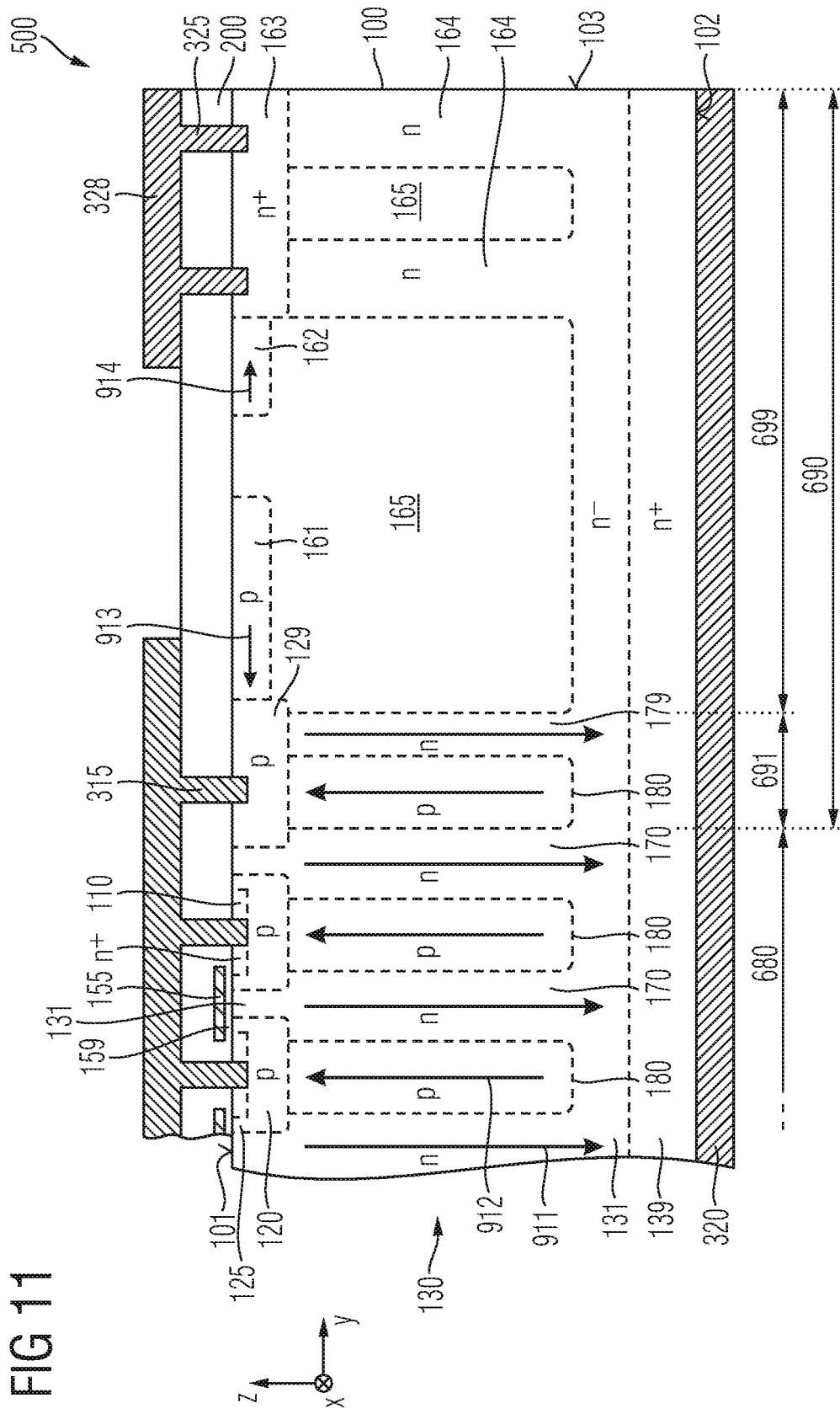
FIG. 11 shows a schematic vertical cross-sectional view of a semiconductor device with stripe-shaped doped regions according to a further embodiment.

FIG. 11 refers to a semiconductor device 500 including a semiconductor body 100 with a first surface 101 at a front side and a second surface 102 opposite to the front side. The first and second surfaces 101, 102 are approximately parallel to each other and may have approximately the same shape and size. A lateral outer surface 103 connects the edges of the first and second surfaces 101, 102.

A central region 680 of the semiconductor body 100 includes functional transistor cells TC. The illustrated embodiment shows transistor cells TC with planar gate electrodes 155 formed above the first surface 101 and a gate dielectric 159 formed between the semiconductor body 100 and the gate electrode 155. P doped wells 120 extend from the first surface 101 into semiconductor body 100. N doped source regions 110 extend from the first surface 101 into the p doped wells 120. The semiconductor body 100 further includes n doped drain regions 131 adjoining the first surface 101 between neighboring p doped wells 120. The gate dielectric 159 separates the gate electrode 155 from one channel portion 125 or two channel portions 125 of two neighboring p doped wells 120. An interlayer dielectric 200 is formed on portions of the first surface 101 and on the gate electrodes 155. A first load electrode 310 is formed on the interlayer dielectric 200. First contact structures 315 extend from the first load electrode 310 through openings in the interlayer dielectric 200 into the semiconductor body 100 and form low-resistive ohmic contacts with both the source regions 110 and the p doped wells 120.

The drain regions 131 form part of a drain/drift structure 130 (e.g., a structure including a drain structure and/or a drift structure) that further includes a heavily doped contact portion 139 formed along the second surface 102. A second load electrode 320 formed from a conductive material is in contact (e.g., direct contact) with the second surface 102 of the semiconductor body 100. The contact portion 139 and the second load electrode 320 form a low-resistive ohmic contact.

The drain/drift structure 130 further includes a charge compensation structure including first doped regions 170 and second doped regions 180. Each first doped region 170 is in contact (e.g., direct contact) with one of the drain regions 131. Each second doped region 180 is in contact with one of the p doped wells 120. The charge compensation structure may be formed in an originally lightly n doped drift layer 131 between the p doped wells 120 and the contact portion 139. The first and second doped regions 170, 180 may be stripe-shaped with longitudinal axes running parallel to the x-axis. The first doped regions 170 and the second doped regions 180 alternate along the y-axis. Along a line parallel to the y-axis through one of the first doped regions 170 and through an adjoining (e.g., directly adjoining) one of the second doped regions 180, an integrated donor density deviates from a half of a sum of the integrated donor density and an integrated acceptor density by at most 20%. A termination region 690 surrounds the central region 680. Along the y-axis the central region 680 includes a peripheral region 699 along the lateral outer surface 103 and a transition region between the central region 680 and the peripheral regions 699.

The transition region 691 may include an outermost p doped well 129 without source regions 110. The transition region 691 may include a complete second doped region 180, which is in contact with the outermost p doped well 129. The transition region 191 further includes a doped region 179 with a width which is approximately 50% of the width of the first doped regions 170 in the central region 680.

The peripheral region 699 may include an edge construction. The edge construction makes the potential of the second load electrode 320 accessible on the front side. The edge construction may include a front side second load contact 328 that may extend laterally separated from the first load electrode 310 along the lateral outer edge 103. An n doped well 163 extends below the front side second load contact 328 from the first surface 101 into the semiconductor body 100. N doped columns 164 may extend from the n doped well 163 into the drift layer 131. The n doped columns 164 and the n doped region 170 may have the same vertical extension and the same vertical dopant distribution. Second contact structures 325 may extend from the front side second load contact 328 through openings in the interlayer dielectric 200 to the n doped well 163. The second load contact structures 325 and the n doped well 163 may form low-resistive ohmic contacts.

A p doped junction extension 161 may extend outwardly from the outermost p doped well 120 along the first surface 101. An n doped junction extension 162 may extend inwardly from the n doped well 163 along the first surface 101. Lightly doped or intrinsic regions 165 may be formed laterally between the outermost doped region 179 and the innermost n doped column 164 and between neighboring n doped columns 164.

Doped regions (e.g., all doped regions) are connected to one of the first and second load electrodes 310, 320. When the semiconductor device 500 switches into a blocking mode, charge carriers can be completely drained off from the semiconductor body 100 along the paths indicated by the arrows 911, 912, 913, 914. The so-called "intrinsic termination" can be combined with the outermost doped region 179 charge compensating the edge of the charge compensation structure.

Figure 12:
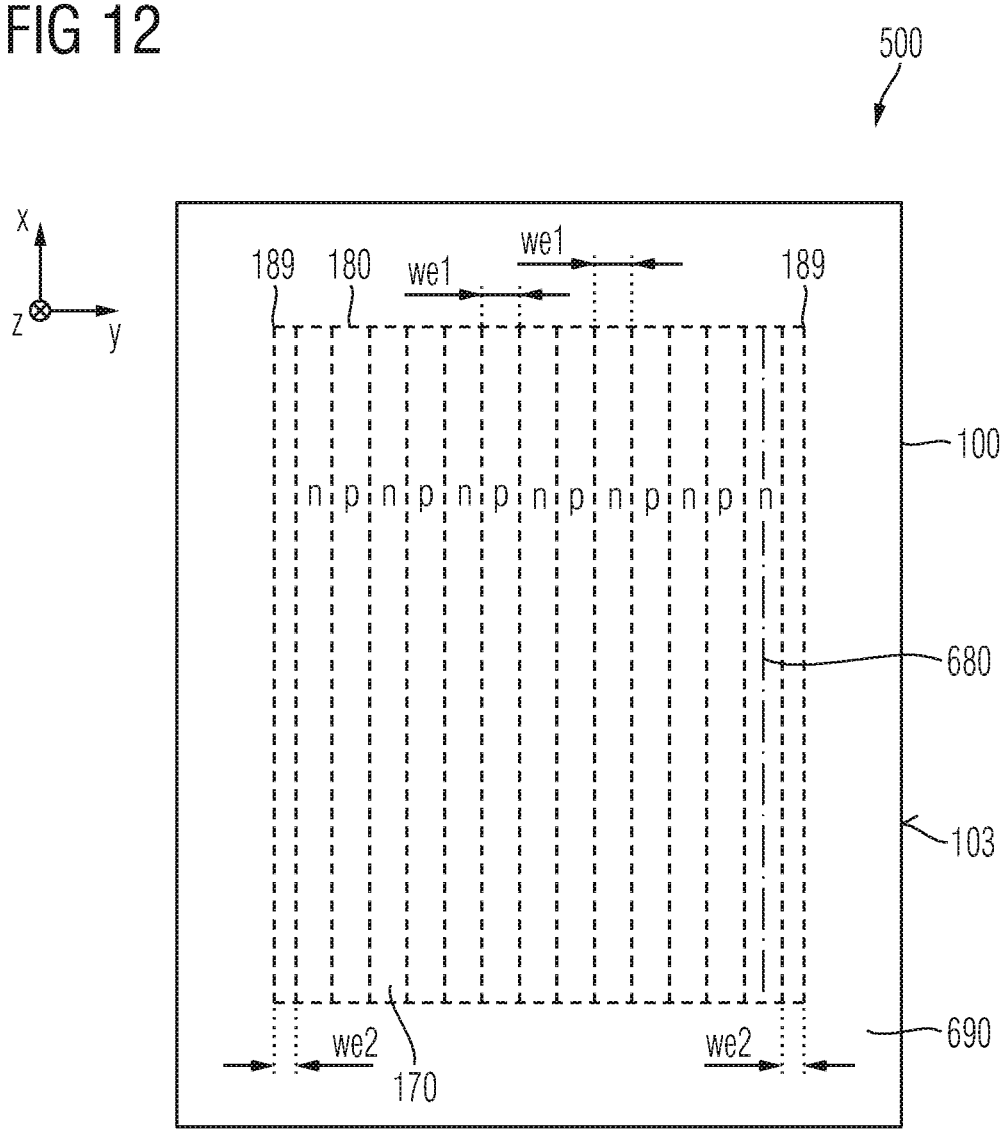
FIG. 12 shows a schematic plan view of a semiconductor device with stripe-shaped doped regions according to an embodiment with an outermost doped region formed from one single implant zone.

FIG. 12 shows stripe-shaped first and second doped regions 170, 180 with longitudinal axes running parallel to the x-axis. The first doped regions 170 and the second doped regions 180 alternate along the y-axis. Along a line parallel to the y-axis through one of the first doped regions 170 and through an adjoining (e.g., directly adjoining) one of the second doped regions 180, an integrated donor density deviates from a half of a sum of the integrated donor density and an integrated acceptor density by at most 20%.

The first and second doped regions 170, 180 between the two outermost ones 189 have a first width extension we1. The two outermost ones 189 of the first and second doped regions 170, 180 along the y-axis have a second width extension we2. The second width extension we2 is in a range from 25% to 75% of the first width extension we1, e.g. about 45% to 55%.

Figure 13A:
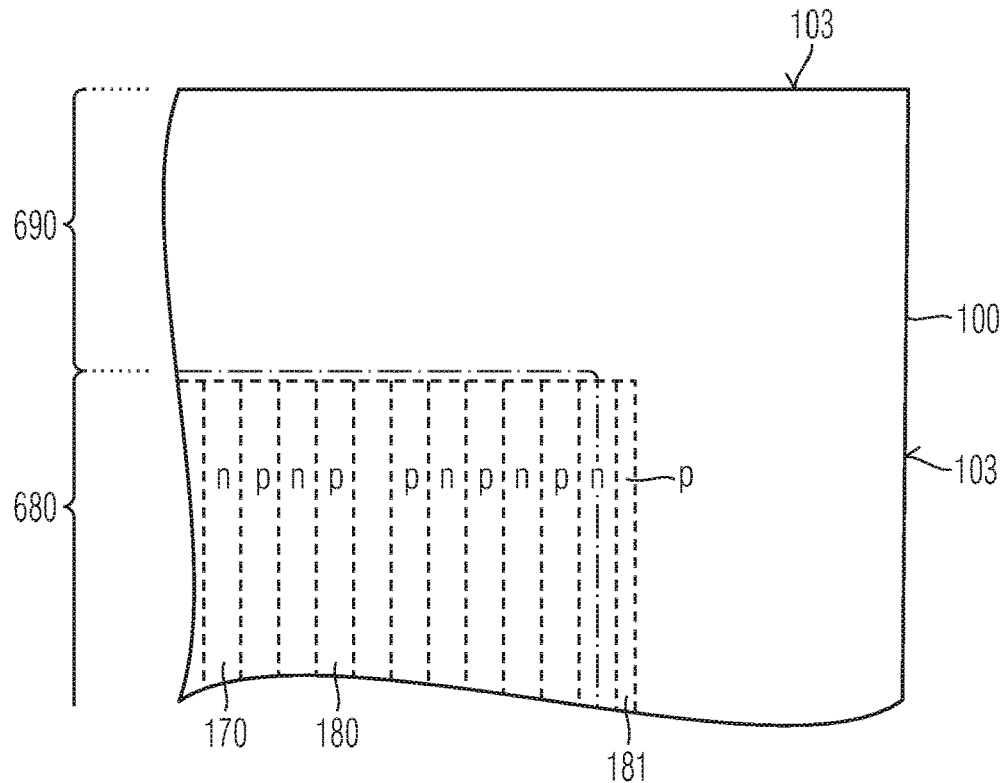
FIGS. 13A-13C show schematic plan views of portions of semiconductor devices with stripe-shaped doped regions according to further embodiments

In FIG. 13A the charge compensation structure including the first and second doped regions 170, 180 and outermost second doped regions 189 ends along the x-axis at an interface between central region 680 and termination region 690.

Figure 13B:
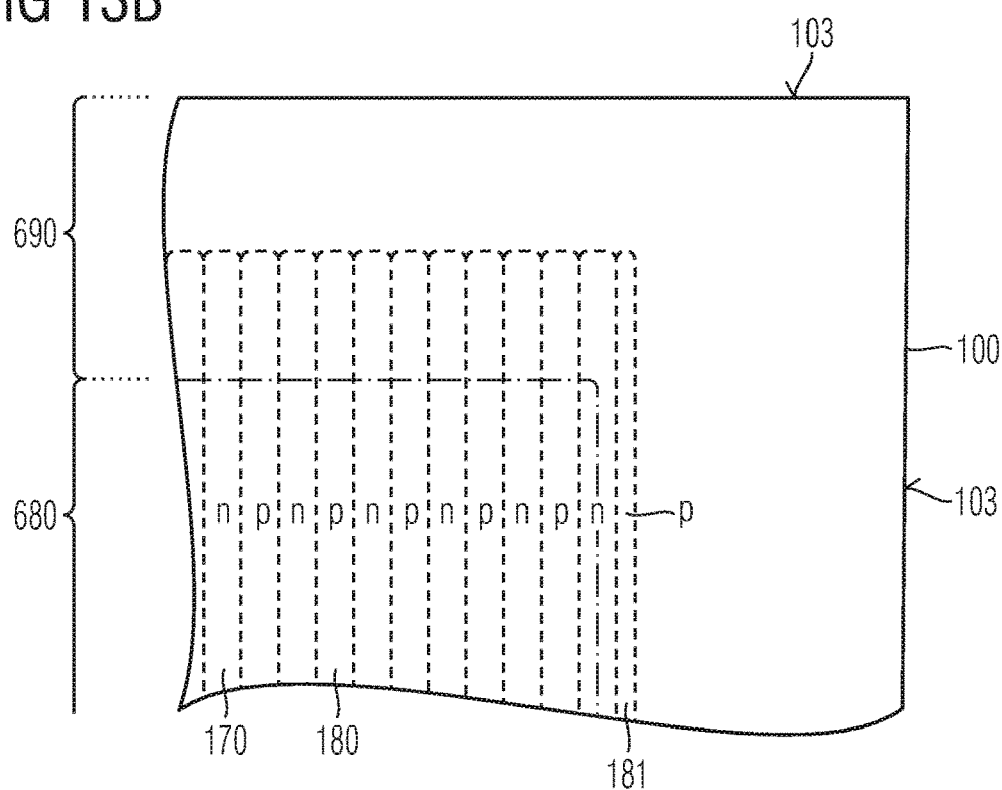

FIG. 13B shows first and second doped regions 170, 180 and outermost doped regions 189 extending along the x-axis into a sub-portion of the termination region 690.

Figure 13C:
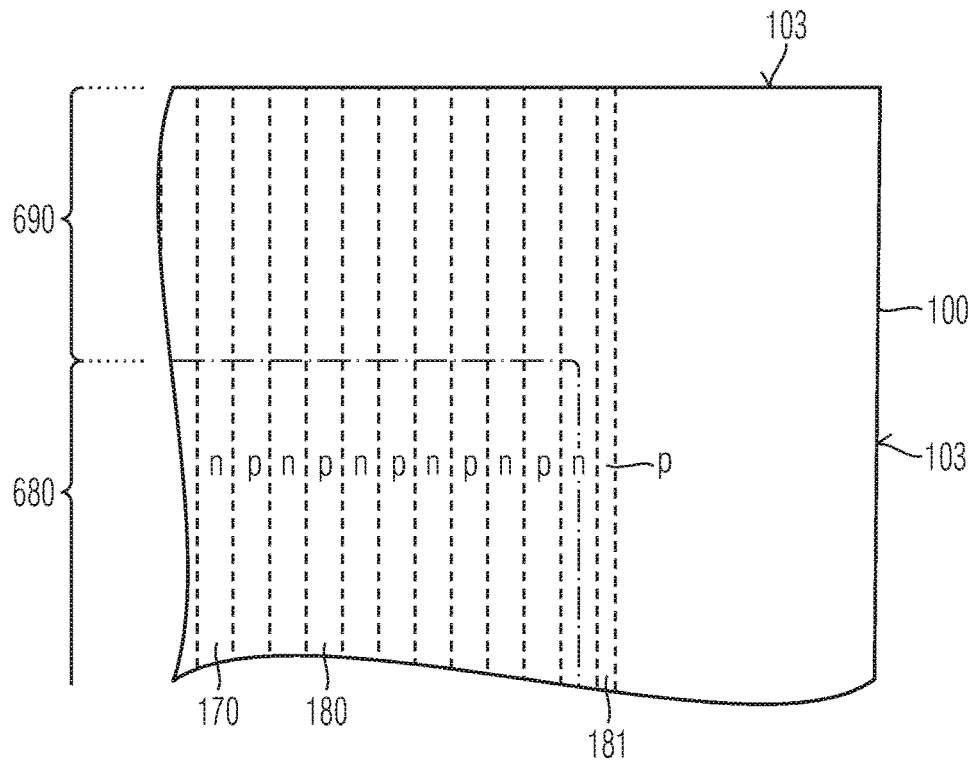

In FIG. 13C the first and second doped regions 170, 180 extend through the termination region 690 and end at the lateral outer surface 103.

Figure 14:
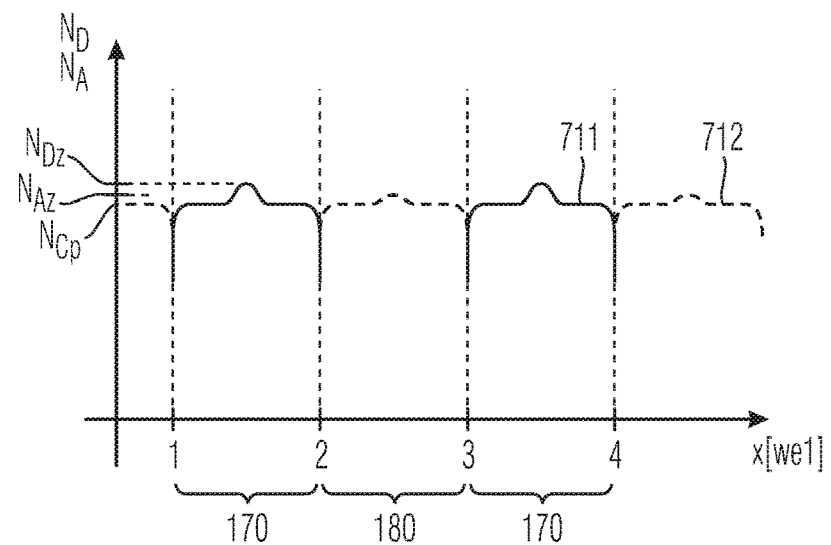
FIG. 14 shows a schematic diagram illustrating a horizontal dopant distribution in the stripe-shaped doped regions of a semiconductor device according to an embodiment.

In FIG. 14 line 711 shows the donator density ND and line 712 shows the acceptor density NA along a line parallel to the y-axis through two first doped regions 170 and two second doped regions 180 as illustrated in any of the previous figures. Each of the doped regions 170, 180 has a first width extension we1. Along a line parallel to the y-axis and across at least 75%, e.g. at least 80%, of the first width extension we1, the dopant concentration in each doped region 170, 180 deviates by not more than 15%, e.g. not more than 10%, from a mean dopant concentration within the doped region along the line. Along the same line, a maximum dopant concentration deviates from the mean dopant concentration by not more than 20% from the mean dopant concentration in the same doped region 170, 180 along the same line. Within the doped region 170, 180 the position of the dopant concentration maximum deviates by not more than 10% of the first width extension we1 from a lateral center of the concerned doped region 170, 180.

The illustrated embodiments refer to semiconductor devices with n-channel transistor cells with n doped source regions and with p doped body regions. Accordingly, the conductivity type of the source regions—or first conductivity type is n-type—and the conductivity type of the body regions—or second conductivity type—is p-type. The disclosure with regard to the n-channel transistor cells may apply, mutatis mutandis, to p-channel transistor cells by reversing the conductivity type of the source and body regions.

The illustrated examples mainly refer to semiconductor devices from a semiconductor material in which the diffusion coefficients for the dopant ions are comparatively small, e.g. SiC. As a consequence, pairs of implant zones, in which the implanted dopants come to rest, and the doped regions formed by the activated implanted dopant ions are illustrated to have almost the same dimensions. Other examples may refer to semiconductor devices based on other semiconductor materials, e.g. Si, in which the doped regions have larger vertical and/or horizontal extensions than the corresponding pair of implant zones.

Though the description focusses on charge compensation structures as an example for the application of stripe-shaped doped regions, the embodiments may also include other applications of complementarily doped stripe-shaped doped regions, e.g. in the field of light receiving devices such as photodiodes and photo cells. Further applications may include a serial arrangement of pn-junctions.

Though the description focusses on mask openings with vertical sidewalls as an example, the embodiments may also include mask openings which sidewalls are tilted with respect to the z-axis. Implant angles between the z-axis and the implantation beam axis may be selected to avoid channeling and/or may be selected to use channeling for obtaining implant zones with high vertical extension (e.g., vertical extension higher than a threshold vertical extension).

What is claimed is:

1. A method of manufacturing a semiconductor device, the method comprising:
   forming a first hard mask on a first surface of a semiconductor body, wherein first openings in the first hard mask expose first surface sections and second openings in the first hard mask expose second surface sections;
   implanting first dopants of a first conductivity type selectively through the first openings into the semiconductor body;
   implanting second dopants of a second conductivity type selectively through the second openings into the semiconductor body, wherein the second conductivity type is complementary to the first conductivity type;
   forming a second hard mask covering the first surface sections and the second surface sections, wherein third openings in the second hard mask expose third surface sections and fourth openings in the second hard mask expose fourth surface sections;
   implanting third dopants of the first conductivity type selectively through the third openings into the semiconductor body; and
   implanting fourth dopants of the second conductivity type selectively through the fourth openings into the semiconductor body.

2. The method according to claim 1, wherein:
   the semiconductor body comprises a silicon carbide layer.

3. The method according to claim 1, wherein:
   at least one of the first openings or the second openings are stripe-shaped with a longitudinal extension along a lateral first direction.

4. The method according to claim 3, wherein:
the first surface sections and the second surface sections alternate along a horizontal second direction orthogonal to the first direction.

5. The method according to claim 3, wherein:
a conductivity type of dopants implanted through an outermost opening of the first openings, the second openings, the third openings, and the fourth openings is complementary to a conductivity type of dopants implanted through a second outermost opening of the first openings, the second openings, the third openings, and the fourth openings.

6. The method according to claim 3, wherein:
the first hard mask comprises a central mask section and a peripheral mask section;
the central mask section and the peripheral mask section are formed along the first direction; and
openings, of the first openings and the second openings, in the peripheral mask section are laterally shifted with respect to openings, of the first openings and the second openings, in the central mask section.

7. The method according to claim 1, comprising:
forming, prior to implanting the first dopants, a first auxiliary mask exposing the first openings and at least one of covering or filling the second openings; and
forming, prior to implanting the second dopants, a second auxiliary mask exposing the second openings and at least one of covering or filling the first openings.

8. The method according to claim 1, wherein:
the second hard mask is formed in the first openings and the second openings of the first hard mask.

9. The method according to claim 1, comprising at least one of:
decreasing, prior to implanting the first dopants and the second dopants, a lateral width of the first openings and the second openings in the first hard mask; or
decreasing, prior to implanting the third dopants and the fourth dopants, a lateral width of the third openings and the fourth openings in the second hard mask.

10. The method according to claim 1, comprising:
activating the first dopants, the second dopants, the third dopants and the fourth dopants, wherein:
the first dopants and the third dopants form first doped regions, in the semiconductor body, below the first surface sections and the third surface sections;
the second dopants and the fourth dopants form second doped regions, in the semiconductor body, below the second surface sections and the fourth surface sections;
along a horizontal line through a first doped region of the first doped regions and through a second doped region of the second doped regions, an integrated donor density deviates from a half of a sum of the integrated donor density and an integrated acceptor density by at most 20%; and
the second doped region adjoins the first doped region.

11. The method according to claim 1, comprising:
forming an epitaxial layer on the first surface of the semiconductor body after implanting the first dopants, the second dopants, the third dopants and the fourth dopants.

12. The method according to claim 11, comprising:
forming a third hard mask on an exposed surface of the epitaxial layer, wherein fifth openings in the third hard mask expose fifth surface sections and sixth openings in the third hard mask expose sixth surface sections;
implanting fifth dopants of the first conductivity type selectively through the fifth openings into the epitaxial layer;
implanting sixth dopants of the second conductivity type selectively through the sixth openings into the epitaxial layer;
forming a fourth hard mask covering the fifth surface sections and the sixth surface sections, wherein seventh openings in the fourth hard mask expose seventh surface sections and eighth openings in the fourth hard mask expose eighth surface sections;
implanting seventh dopants of the first conductivity type selectively through the seventh openings into the epitaxial layer; and
implanting eighth dopants of the second conductivity type selectively through the eighth openings into the semiconductor body.

13. The method according to claim 12, wherein:
at least one of the fifth openings or the sixth openings are stripe-shaped with a longitudinal extension along a lateral first direction.

14. The method according to claim 13, wherein:
the fifth surface sections and the sixth surface sections alternate along a horizontal second direction orthogonal to the first direction.

15. The method according to claim 13, wherein:
a conductivity type of dopants implanted through an outermost opening of the fifth openings, the sixth openings, the seventh openings, and the eighth openings is complementary to a conductivity type of dopants implanted through a second outermost opening of the fifth openings, the sixth openings, the seventh openings, and the eighth openings.

16. The method according to claim 13, wherein:
the third hard mask comprises a central mask section and a peripheral mask section;
the central mask section and the peripheral mask section are formed along the first direction; and
openings, of the fifth openings and the sixth openings, in the peripheral mask section are laterally shifted with respect to openings, of the fifth openings and the sixth openings, in the central mask section.

17. The method according to claim 12, wherein:
the fourth hard mask is formed in the fifth openings and the sixth openings of the third hard mask.

* * * * *